US012159816B2

(12) United States Patent
Nasu

(10) Patent No.: US 12,159,816 B2
(45) Date of Patent: Dec. 3, 2024

(54) SEMICONDUCTOR DEVICE WITH LEAD BETWEEN A PLURALITY OF ENCAPSULATED MOSFETS

(71) Applicant: ROHM CO., LTD., Kyoto (JP)

(72) Inventor: Kentaro Nasu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/492,586

(22) Filed: Oct. 23, 2023

(65) Prior Publication Data

US 2024/0055329 A1    Feb. 15, 2024

Related U.S. Application Data

(63) Continuation of application No. 17/290,087, filed as application No. PCT/JP2019/044711 on Nov. 14, 2019, now Pat. No. 11,830,792.

(30) Foreign Application Priority Data

Nov. 19, 2018  (JP) ................. 2018-216458

(51) Int. Cl.
*H01L 23/495*    (2006.01)
*H01L 23/00*    (2006.01)
(Continued)

(52) U.S. Cl.
CPC .... *H01L 23/49527* (2013.01); *H01L 23/3107* (2013.01); *H01L 23/3121* (2013.01);
(Continued)

(58) Field of Classification Search
CPC ....... H01L 25/074; H01L 24/24; H01L 24/25; H01L 24/33; H01L 24/73; H01L 24/82;
(Continued)

(56) References Cited

U.S. PATENT DOCUMENTS 7,202,105 B2 *  4/2007  Carney ............. H01L 23/49575
                                                    257/E25.018
9,107,290 B1 *  8/2015  Chen .................... H05K 3/0061
(Continued)

FOREIGN PATENT DOCUMENTS

| JP | 2007-234994 A | 9/2007 |
| JP | 2010-245212 A | 10/2010 |
| JP | 2012-178504 A | 9/2012 |

OTHER PUBLICATIONS

Office Action received in the corresponding Chinese Patent application, Nov. 1, 2023, and machine translation (10 pages).
(Continued)

*Primary Examiner* — Alonzo Chambliss
(74) *Attorney, Agent, or Firm* — HSML P.C.

(57) ABSTRACT

The semiconductor device includes first and second semiconductor elements. Each element has an obverse surface and a reverse surface, with a first electrode arranged on the reverse surface, and with a second electrode arranged on the obverse surface. The semiconductor device further includes: a first lead having an obverse surface and a reverse surface; an insulating layer covering the first lead, the first semiconductor element and the second semiconductor element; a first electrode connected to the second electrode of the first semiconductor element; and a second electrode connected to the first lead. The first semiconductor element and the first lead are bonded to each other with the reverse surface of the first semiconductor element facing the lead obverse surface. The second semiconductor element and the first lead are bonded to each other with the reverse surface of the second semiconductor element facing the lead reverse surface.

21 Claims, 21 Drawing Sheets

(51) Int. Cl.
*H01L 23/31* (2006.01)
*H01L 25/07* (2006.01)

(52) U.S. Cl.
CPC .. *H01L 23/49513* (2013.01); *H01L 23/49562* (2013.01); *H01L 23/49575* (2013.01); *H01L 24/24* (2013.01); *H01L 24/25* (2013.01); *H01L 24/33* (2013.01); *H01L 24/73* (2013.01); *H01L 24/82* (2013.01); *H01L 24/92* (2013.01); *H01L 25/074* (2013.01); H01L 23/3135 (2013.01); H01L 24/29 (2013.01); H01L 24/30 (2013.01); H01L 24/32 (2013.01); H01L 2224/24175 (2013.01); H01L 2224/244 (2013.01); H01L 2224/25171 (2013.01); H01L 2224/29139 (2013.01); H01L 2224/30505 (2013.01); H01L 2224/32245 (2013.01); H01L 2224/3315 (2013.01); H01L 2224/73267 (2013.01); H01L 2224/82101 (2013.01); H01L 2224/82106 (2013.01); H01L 2224/92244 (2013.01); H01L 2924/13091 (2013.01); H01L 2924/15153 (2013.01); H01L 2924/15162 (2013.01)

(58) Field of Classification Search
CPC ............... H01L 24/92; H01L 23/49527; H01L 23/3121; H01L 23/49513; H01L 23/49562; H01L 23/49575; H01L 2924/181; H01L 23/3107; H01L 23/31; H01L 24/16; H01L 24/17
See application file for complete search history.

(56) References Cited

U.S. PATENT DOCUMENTS

| | | | |
|---|---|---|---|
| 11,830,792 B2* | 11/2023 | Nasu | ........................ H01L 23/48 |
| 2005/0285249 A1 | 12/2005 | Carney et al. | |
| 2012/0248539 A1 | 10/2012 | Zhang et al. | |
| 2013/0049137 A1 | 2/2013 | Uno et al. | |
| 2014/0159212 A1 | 6/2014 | Hung et al. | |
| 2017/0347458 A1* | 11/2017 | Lai | ........................ H05K 1/185 |
| 2020/0144162 A1 | 5/2020 | Chaowasakoo et al. | |

OTHER PUBLICATIONS

Office Action received in the corresponding Japanese Patent application, Dec. 6, 2022, and machine translation (8 pages).
International Search Report issued in PCT/JP2019/044711, Jan. 28, 2020 (2 pages).
Office Action received in the corresponding Chinese Patent application, May 18, 2023, and machine translation (12 pages).
Office Action received in the corresponding Japanese Patent application, Jun. 25, 2024, and machine translation (4 pages).
Notice of Reexamination received in the corresponding Chinese Patent application, Jun. 17, 2024, and machine translation (16 pages).

* cited by examiner

SEMICONDUCTOR DEVICE WITH LEAD BETWEEN A PLURALITY OF ENCAPSULATED MOSFETS

TECHNICAL FIELD

The present disclosure relates to a semiconductor device.

BACKGROUND ART

There is an increasing demand for a power semiconductor device that is used in a power device, for example, and that is provided with a plurality of power semiconductor elements such as metal-oxide-semiconductor field-effect transistors (MOSFETs). Patent document 1 discloses an example of a conventional semiconductor device. The semiconductor device disclosed in the patent document 1 is provided with an insulating substrate and a plurality of semiconductor elements mounted thereon by bonding the back electrodes of the semiconductor elements to the conductor pattern formed on one of the surfaces of the insulating substrate.

The surface area of the semiconductor device (the area of a surface perpendicular to the thickness direction) is required to be smaller so that the semiconductor device can be mounted in a smaller area. Accordingly, the surface area of each semiconductor element provided for the semiconductor device is also required to be small enough. In the case of a MOSFET, the on-resistance increases as the surface area decreases, which is problematic.

PRIOR ART DOCUMENT

Patent Document

Patent Document 1: JP-A-2010-245212

SUMMARY OF THE INVENTION

Technical Problem

The present disclosure has been conceived in view of the problem noted above, and aims to provide a semiconductor device capable of suppressing a reduction in the surface area of semiconductor elements provided for the semiconductor device.

Solution to Problem

In accordance with the present disclosure, there is provided a semiconductor device including a first semiconductor element and a second semiconductor element, each of which has an element obverse surface and an element reverse surface that face opposite to each other in a thickness direction, with an element first electrode arranged on the element reverse surface, and with an element second electrode arranged on the element obverse surface. The semiconductor device further includes: a first lead having a lead obverse surface and a lead reverse surface that face opposite to each other in the thickness direction; an insulating layer covering the first lead, the first semiconductor element, and the second semiconductor element; a first electrode electrically connected to the element second electrode of the first semiconductor element; and a second electrode electrically connected to the first lead. The first semiconductor element and the first lead are bonded to each other with the element reverse surface of the first semiconductor element facing the lead obverse surface. The second semiconductor element and the first lead are bonded to each other with the element reverse surface of the second semiconductor element facing the lead reverse surface.

Advantages of Invention

In the semiconductor device according to the present disclosure, the first semiconductor element is mounted on the lead obverse surface of the first lead, and the second semiconductor element is mounted on the lead reverse surface of the first lead. Accordingly, the surface area of each of the semiconductor elements can be relatively large as compared to the case where the first semiconductor element and the second semiconductor element are arranged side by side on the same surface of the first lead.

Other features and advantages of the present disclosure will be more apparent from the detailed description given below with reference to the accompanying drawings.

MODE FOR CARRYING OUT THE INVENTION

Figure 1:
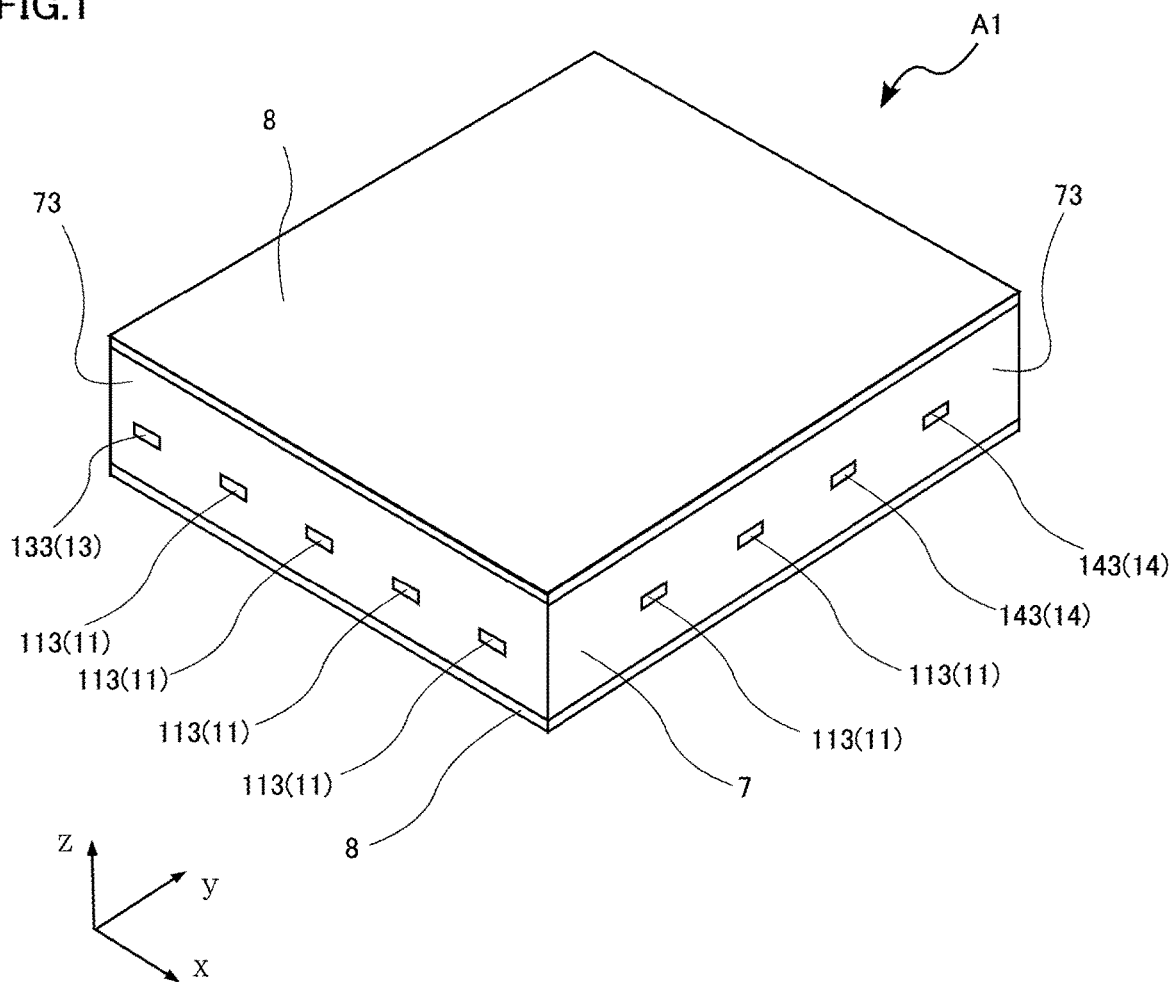
FIG. 1 is a perspective view showing a semiconductor device according to a first embodiment of the present disclosure.

Preferred embodiments of the present disclosure will be described below in detail with reference to the attached drawings.

The following describes a semiconductor device A1 according to a first embodiment of the present disclosure, with reference to FIGS. 1 to 6. The semiconductor device A1 includes a first lead 11, a third lead 13, a fourth lead 14, via holes 211 to 214, and 221 to 225, wiring patterns 311, 312, and 321 to 324, a first electrode 41, a second electrode 42, a third electrode 43, a fifth electrode 45, conductive bonding layers 51, semiconductor elements 6a and 6b, an insulating layer 7, and insulating films 8.

Figure 2:
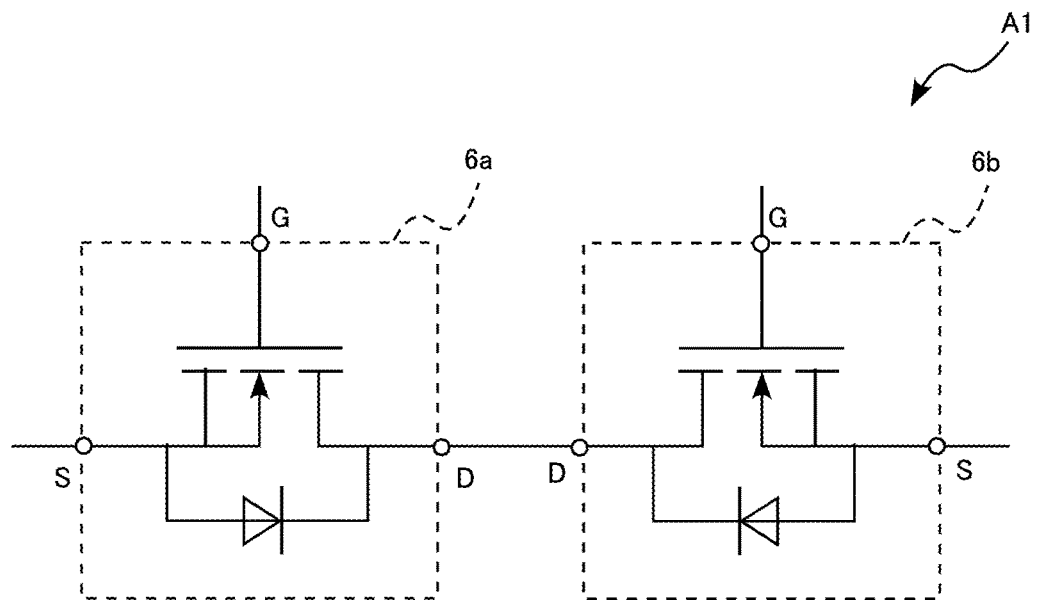
FIG. 2 is a circuit diagram showing the semiconductor device of FIG. 1.
Figure 3:
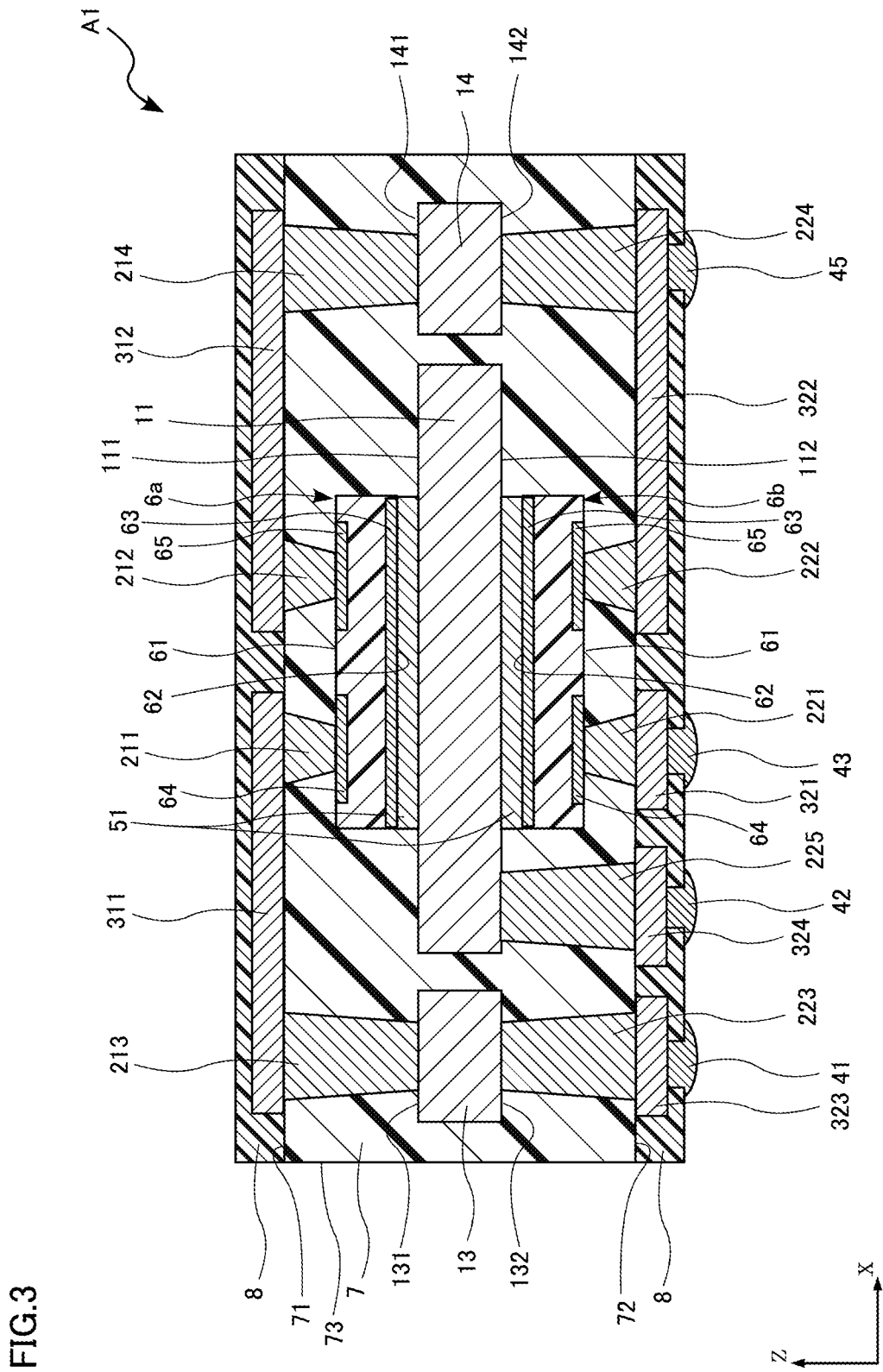
FIG. 3 is a schematic cross-sectional view showing the semiconductor device of FIG. 1.
Figure 4:
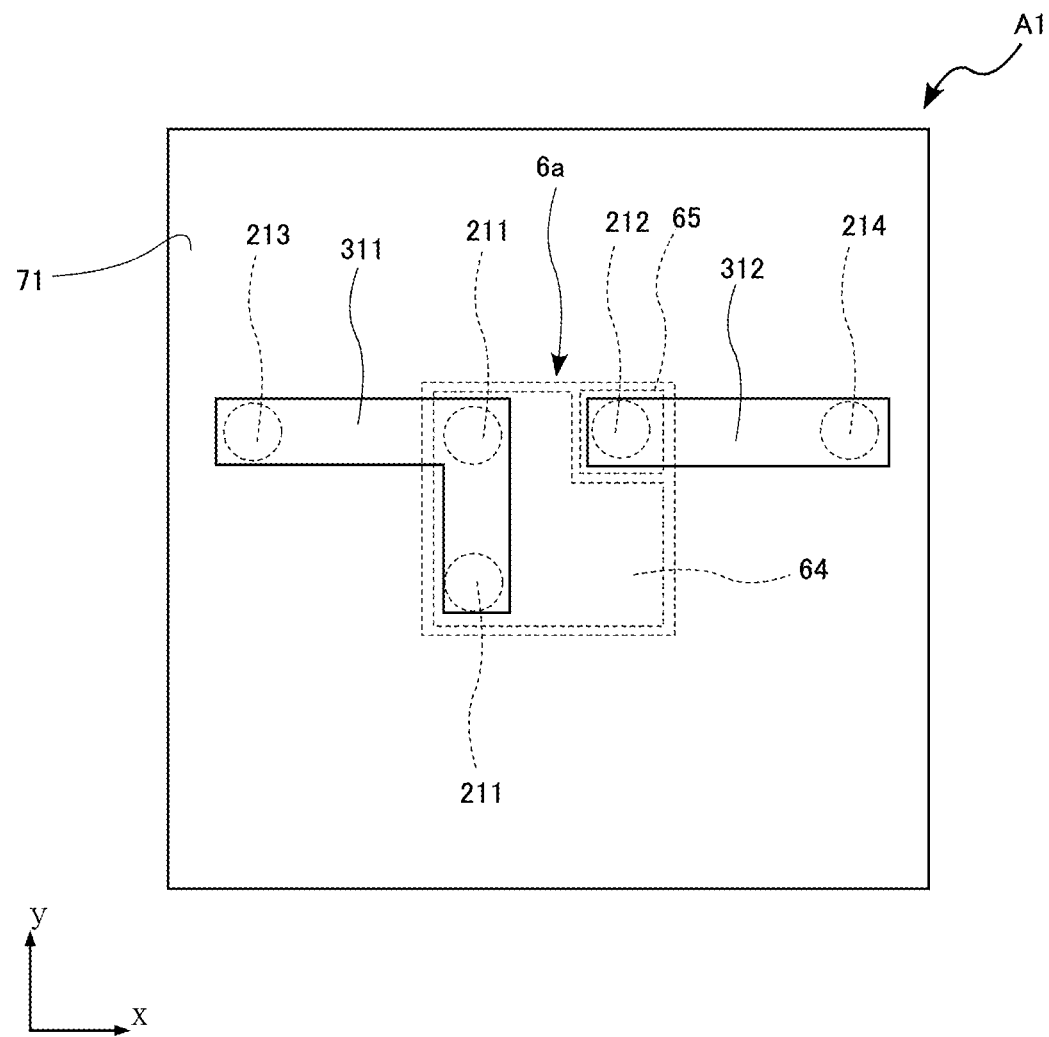
FIG. 4 is a plan view showing a portion of the semiconductor device of FIG. 1 as transparent.
Figure 5:
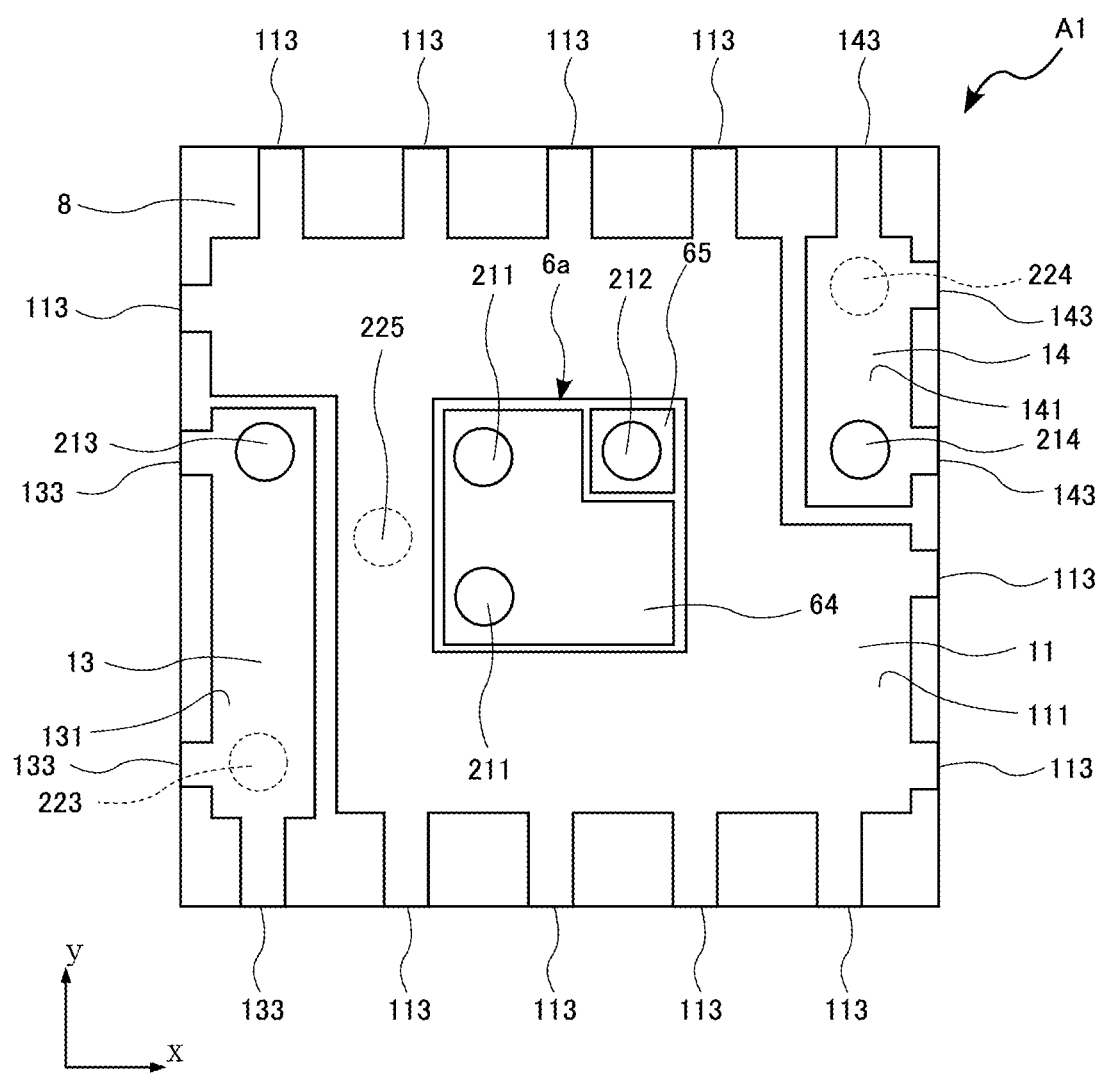
FIG. 5 is a plan view showing a portion of the semiconductor device of FIG. 1 as transparent.
Figure 6:
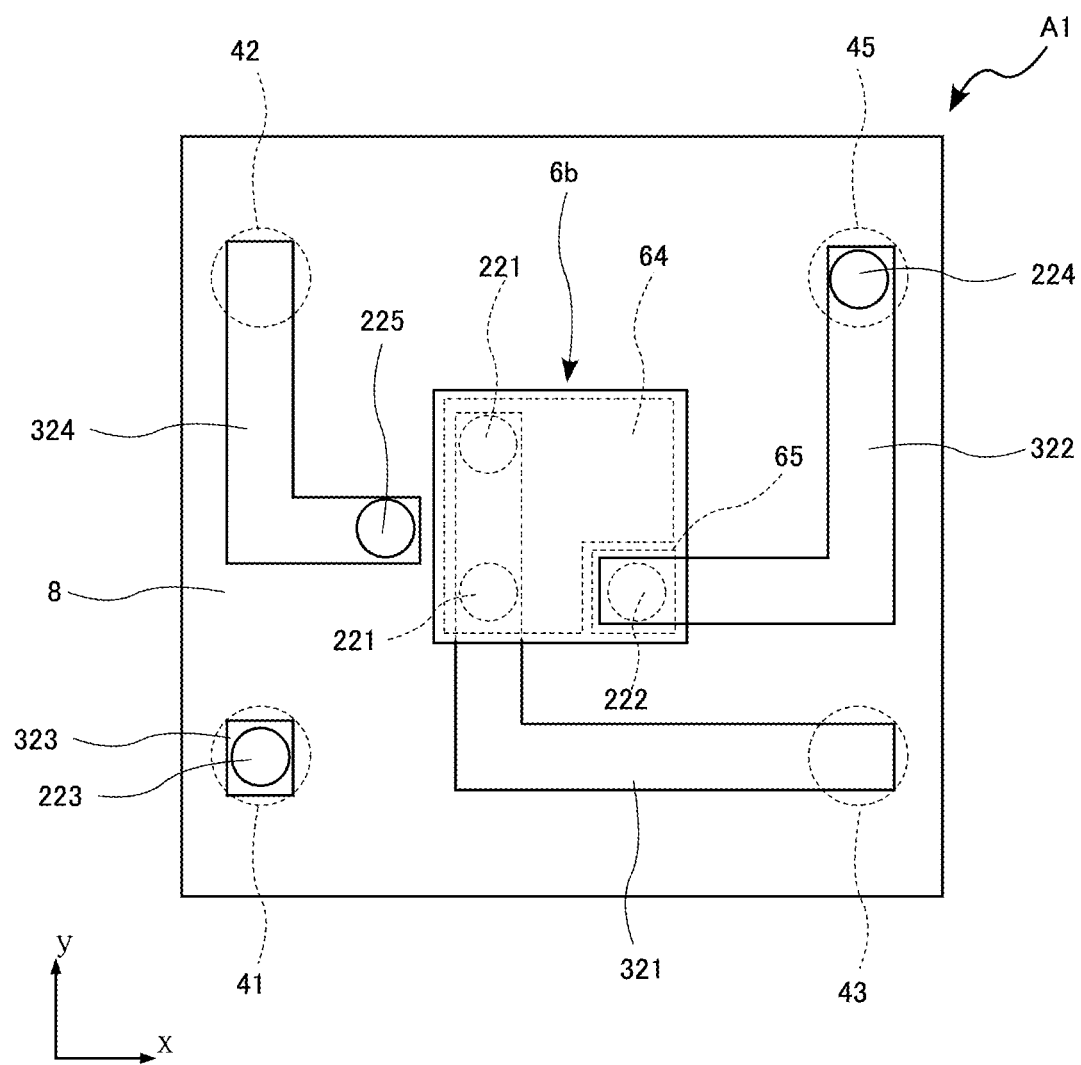
FIG. 6 is a plan view showing a portion of the semiconductor device of FIG. 1 as transparent.

FIG. 1 is a perspective view showing the semiconductor device A1. FIG. 2 is a circuit diagram showing the semiconductor device A1. FIG. 3 is a schematic cross-sectional view of the semiconductor device A1, revealing the members of the semiconductor device A1 so that conductive paths can be easily understood. In practice, via holes and wiring patterns are integrated, but they are provided with different styles of hatching as separate members for distinction in FIG. 3. FIGS. 4 to 6 are plan views of the semiconductor device A1, showing a portion of the semiconductor device A1 as transparent. In FIG. 4, the insulating film 8 positioned on the upper side (upper side in FIG. 3) is shown as transparent. In FIG. 5, the insulating film 8 on the upper side, the wiring patterns 311 and 312, and the insulating layer 7 are shown as transparent. In FIG. 6, the insulating film 8 on the upper side, the wiring patterns 311 and 312, the insulating layer 7, the via holes 211 to 214, the first lead 11, the third lead 13, and the fourth lead 14 are shown as transparent.

The semiconductor device A1 shown in these figures is surface-mountable on a circuit board for any one of various devices. The semiconductor device A1 has a rectangular shape as viewed in a thickness direction. For convenience of description, the thickness direction of the semiconductor device A1 is defined as z direction, the direction perpendicular to the z direction and extending along one side of the semiconductor device A1 is defined as x direction, and the direction perpendicular to both the z direction and the x direction is defined as y direction. The same applies to the following figures. The dimensions of the semiconductor device A1 are not particularly limited. In the present embodiment, the semiconductor device A1 may have dimensions of approximately 2 to 6 mm in the x direction, approximately 2 to 6 mm in the y direction, and approximately 0.5 to 1 mm in the z direction.

The first lead 11 supports the semiconductor elements 6a and 6b and is electrically connected to the semiconductor elements 6a and 6b. The third lead 13 is electrically connected to the semiconductor element 6a. The fourth lead 14 is electrically connected to the semiconductor elements 6a and 6b. The first lead 11, the third lead 13, and the fourth lead 14 are formed by, for example, stamping or etching a metal plate. The first lead 11, the third lead 13, and the fourth lead 14 are made of metal, preferably Cu, Ni, an alloy of these metals, or 42 Alloy, for example. In the present embodiment, the first lead 11, the third lead 13, and the fourth lead 14 are made of Cu. Each of the first lead 11, the third lead 13, and the fourth lead 14 may have a thickness of 0.08 to 0.3 mm, for example, and has a thickness of approximately 0.15 mm in the present embodiment. The material and thickness of the first lead 11, the third lead 13, and the fourth lead 14 are not particularly limited.

As shown in FIG. 5, the first lead 11 is arranged in the center of the semiconductor device A1 as viewed in the z direction. The third lead 13 is arranged at the lower left end of the semiconductor device A1 in FIG. 5 and spaced apart from the first lead 11. The fourth lead 14 is arranged at the upper right end of the semiconductor device A1 in FIG. 5 and spaced apart from the first lead 11. The arrangement, shape, and size of each of the first lead 11, the third lead 13, and the fourth lead 14 are not limited to the above example, and may be designed as appropriate.

The first lead 11 has an obverse surface 111, a reverse surface 112, and end surfaces 113. The obverse surface 111 and the reverse surface 112 face opposite to each other in the z direction. The obverse surface 111 faces upward in FIG. 3. The obverse surface 111 is a surface on which the semiconductor element 6a is mounted. The reverse surface 112 faces downward in FIG. 3. The reverse surface 112 is a surface on which the semiconductor element 6b is mounted. Each of the end surfaces 113 is a cut surface formed by cutting a tie bar that connects the first lead 11 and a frame in a lead frame. The end surfaces 113 are exposed from the insulating layer 7.

The third lead 13 has an obverse surface 131, a reverse surface 132, and end surfaces 133. The obverse surface 131 and the reverse surface 132 face opposite to each other in the z direction. The obverse surface 131 faces upward in FIG. 3. The reverse surface 132 faces downward in FIG. 3. Each of the end surfaces 133 is a cut surface formed by cutting a tie bar that connects the third lead 13 and the frame in the lead frame. The end surfaces 133 are exposed from the insulating layer 7.

The fourth lead 14 has an obverse surface 141, a reverse surface 142, and end surfaces 143. The obverse surface 141 and the reverse surface 142 face opposite to each other in the z direction. The obverse surface 141 faces upward in FIG. 3. The reverse surface 142 faces downward in FIG. 3. Each of the end surfaces 143 is a cut surface formed by cutting a tie bar that connects the fourth lead 14 and the frame in the lead frame. The end surfaces 143 are exposed from the insulating layer 7.

As shown in FIG. 3, the obverse surface 111 of the first lead 11, the obverse surface 131 of the third lead 13, and the obverse surface 141 of the fourth lead 14 are flush with each other. Furthermore, the reverse surface 112 of the first lead 11, the reverse surface 132 of the third lead 13, and the reverse surface 142 of the fourth lead 14 are flush with each other.

The semiconductor elements 6a and 6b serve the electrical functions of the semiconductor device A1. In the following description, the semiconductor elements 6a and 6b are referred to as "semiconductor elements 6" when no distinction is necessary. As shown in FIG. 2, the semiconductor elements 6 are N-type MOSFETs in the present embodiment. The semiconductor elements 6 may be other transistors or other semiconductor elements. Each of the semiconductor elements 6 includes an element obverse surface 61, an element reverse surface 62, an element first electrode 63, an element second electrode 64, and an element third electrode 65.

The element obverse surface 61 and the element reverse surface 62 face opposite to each other in the z direction. The element first electrode 63 is arranged on the element reverse surface 62. The element second electrode 64 and the element third electrode 65 are arranged on the element obverse surface 61. In the present embodiment, the element first electrode 63 is a drain electrode, the element second electrode 64 is a source electrode, and the element third electrode 65 is a gate electrode.

As shown in FIG. 5, the semiconductor element 6a is mounted on the center of the obverse surface 111 of the first lead 11. Furthermore, as shown in FIG. 3, the semiconductor element 6a is bonded to the first lead 11 via the conductive bonding layer 51, with the element reverse surface 62 and the obverse surface 111 facing each other. As such, the element first electrode 63 of the semiconductor element 6a is electrically connected to the first lead 11 via the conductive bonding layer 51. The semiconductor element 6b is mounted on the center of the reverse surface 112 of the first lead 11. Furthermore, as shown in FIG. 3, the semiconductor element 6b is bonded to the first lead 11 via the conductive bonding layer 51, with the element reverse surface 62 and the reverse surface 112 facing each other. As such, the element first electrode 63 of the semiconductor element 6b is electrically connected to the first lead 11 via the conductive bonding layer 51. The element first electrode 63 of the semiconductor element 6a and the element first electrode 63 of the semiconductor element 6b are both electrically connected to the first lead 11. In other words, the semiconductor device A1 is a common drain circuit (see FIG. 2) in which the drain electrodes of the two semiconductor elements 6a and 6b are connected to each other.

As shown in FIG. 3, the conductive bonding layers 51 are conductors, one of which is interposed between the first lead 11 and the semiconductor element 6a and the other between the first lead 11 and the semiconductor element 6b. The conductive bonding layers 51 bond the semiconductor elements 6a and 6b to the first lead 11, and ensure that each of the element first electrodes 63 of the semiconductor elements 6a and 6b is electrically connected to the first lead 11. In the present embodiment, each of the conductive bonding layers 51 is formed by applying and thermally curing a conductive bonding material. The conductive bonding material is a bonding material (Ag paste) made of a synthetic resin that is mainly composed of an epoxy resin containing Ag, for example. Note that the conductive bonding material may be another material such as a sintering paste or solder. The method for forming the conductive bonding layers 51 is not limited as long as the conductive bonding layers 51 are made of a conductive material.

The insulating layer 7 covers the first lead 11, the third lead 13, the fourth lead 14, and the semiconductor elements 6a and 6b. The insulating layer 7 is made of prepreg, for example. The prepreg is a reinforced plastic molding material obtained by evenly impregnating a fibrous reinforcing material such as carbon fiber with a thermosetting resin such as an epoxy resin and heating or drying the impregnated material to a semi-cured state. The material of the insulating layer 7 is not particularly limited, and may be any electrically insulative material. The insulating layer 7 has an insulating-layer obverse surface 71, an insulating-layer reverse surface 72, and insulating-layer side surfaces 73. The insulating-layer obverse surface 71 and the insulating-layer reverse surface 72 face opposite to each other in the z direction. The insulating-layer obverse surface 71 faces upward in FIG. 3, and the insulating-layer reverse surface 72 faces downward in FIG. 3. Each of the insulating-layer side surfaces 73 connects the insulating-layer obverse surface 71 and the insulating-layer reverse surface 72, and faces in either the x direction or the y direction. In the present embodiment, the end surfaces 113 of the first lead 11, the end surfaces 133 of the third lead 13, and the end surfaces 143 of the fourth lead 14 are exposed from the insulating-layer side surfaces 73. The end surfaces 113 of the first lead 11, the end surfaces 133 of the third lead 13, and the end surfaces 143 of the fourth lead 14 are flush with the insulating-layer side surfaces 73.

The via holes 211 to 214, and 221 to 225 serve as conductive paths, which are made up of conductive layers formed by plating the inner surfaces of holes formed within the insulating layer 7. The conductive layers are made of a metal such as Cu. In the present embodiment, the via holes 211 to 214, and 221 to 225 are created by forming holes in the insulating layer 7 by a laser, for example, forming underlying layers, which are thin Cu layers, on the inner surfaces of the holes by electroless plating, and forming Cu plating layers by electroplating with the underlying layers used as conductive paths. The method for forming the via holes 211 to 214, and 221 to 225 is not particularly limited. The structure of each of the via holes 211 to 214, and 221 to 225 is not particularly limited. For example, the via holes 211 to 214, and 221 to 225 may be filled with conductors or the insulating films 8, or may be hollow.

The via holes 211 to 214 are open to the insulating-layer obverse surface 71 of the insulating layer 7 and extend in the z direction. As shown in FIG. 3, the via hole 211 is in contact with and electrically connected to the element second electrode 64 of the semiconductor element 6a. The via hole 212 is in contact with and electrically connected to the element third electrode 65 of the semiconductor element 6a. The via hole 213 is in contact with the obverse surface 131 of the third lead 13 and electrically connected to the third lead 13. The via hole 214 is in contact with the obverse surface 141 of the fourth lead 14 and electrically connected to the fourth lead 14. In the present embodiment, two via holes 211 are arranged as shown in FIG. 5. Note that the number and arrangement of via holes 211 to 214 are not limited to the above example, and may be designed as appropriate.

The via holes 221 to 225 are open to the insulating-layer reverse surface 72 of the insulating layer 7, and extend in the z direction. As shown in FIG. 3, the via hole 221 is in contact with and electrically connected to the element second electrode 64 of the semiconductor element 6b. The via hole 222 is in contact with and electrically connected to the element third electrode 65 of the semiconductor element 6b. The via hole 223 is in contact with the reverse surface 132 of the third lead 13 and electrically connected to the third lead 13. The via hole 224 is in contact with the reverse surface 142 of the fourth lead 14 and electrically connected to the fourth lead 14. The via hole 225 is in contact with the reverse surface 112 of the first lead 11 and electrically connected to the first lead 11. In the present embodiment, two via holes 221 are arranged as shown in FIG. 6. Note that the number and arrangement of via holes 221 to 225 are not limited to the above example, and may be designed as appropriate.

The wiring patterns 311, 312, and 321 to 324 are formed on either the insulating-layer obverse surface 71 or the insulating-layer reverse surface 72 of the insulating layer 7 and serve as conductive paths. In the present embodiment, the wiring patterns 311, 312, and 321 to 324 are made of a metal such as Cu. In the present embodiment, the wiring patterns 311, 312, and 321 to 324 are created by forming thin Cu films by electroless plating, and performing electroplating with the thin Cu films used as conductive paths. The method for forming the wiring patterns 311, 312, and 321 to 324 is not particularly limited.

The wiring patterns 311 and 312 are formed on the insulating-layer obverse surface 71 and spaced apart from each other. As shown in FIGS. 3 and 4, the wiring pattern 311 is in contact with the via holes 211 and 213, and electrically connects the via holes 211 and the via hole 213. The wiring pattern 312 is in contact with the via holes 212 and 214, and electrically connects the via hole 212 and the via hole 214. The shape and arrangement of each of the wiring patterns 311 and 312 are not limited to the above example, and may be designed as appropriate.

The wiring patterns 321 to 324 are formed on the insulating-layer reverse surface 72 and spaced apart from each other. As shown in FIGS. 3 and 6, the wiring pattern 321 is in contact with and electrically connected to the via holes 221. The wiring pattern 322 is in contact with the via holes 222 and 224, and electrically connects the via hole 222 and the via hole 224. The wiring pattern 323 is in contact with and electrically connected to the via hole 223. The wiring pattern 324 is in contact with and electrically connected to the via hole 225. The shape and arrangement of each of the wiring patterns 321 to 324 are not limited to the above example, and may be designed as appropriate.

The first electrode 41, the second electrode 42, the third electrode 43, and the fifth electrode 45 are electrode pads for mounting the semiconductor device A1 on a surface of a circuit board (not illustrated) and arranged in the reverse surface of the semiconductor device A1 (i.e., on the insulating-layer reverse surface 72 of the insulating layer 7). In the present embodiment, as shown in FIG. 6, each of the first electrode 41, the second electrode 42, the third electrode 43, and the fifth electrode 45 is a conductor having a circular shape as viewed in the z direction. For example, each of the first electrode 41, the second electrode 42, the third electrode 43, and the fifth electrode 45 is made up of a Ni layer, a Pd layer, and a Au layer that are stacked on each other, and is formed by electroless plating. Note that the material, shape, thickness, arrangement, and forming method of each of the first electrode 41, the second electrode 42, the third electrode 43, and the fifth electrode 45 are not particularly limited. For example, these electrodes may be solder balls.

The first electrode 41 is in contact with and electrically connected to the wiring pattern 323. The second electrode 42 is in contact with and electrically connected to the wiring pattern 324. The third electrode 43 is in contact with and electrically connected to the wiring pattern 321. The fifth electrode 45 is in contact with and electrically connected to the wiring pattern 322.

The first lead 11, the third lead 13, the fourth lead 14, the via holes 211 to 214, and 221 to 225, and the wiring patterns 311, 312, and 321 to 324 form a conductive path between each of the electrodes of the semiconductor elements 6a and 6b and each of the first electrode 41, the second electrode 42, the third electrode 43, and the fifth electrode 45.

The first electrode 41 is electrically connected to the element second electrode 64 (source electrode) of the semiconductor element 6a via the wiring pattern 323, the via hole 223, the third lead 13, the via hole 213, the wiring pattern 311, and the via holes 211. Accordingly, the first electrode 41 functions as a source terminal of the semiconductor element 6a. The second electrode 42 is electrically connected to the element first electrode 63 (drain electrode) of the semiconductor element 6a and the element first electrode 63 (drain electrode) of the semiconductor element 6b via the wiring pattern 324, the via hole 225, and the first lead 11. Accordingly, the second electrode 42 functions as a drain terminal of each of the semiconductor element 6a and the semiconductor element 6b. The semiconductor device A1 is a common drain circuit (see FIG. 2) in which the drain electrodes of the two semiconductor elements 6a and 6b are connected to each other.

The third electrode 43 is electrically connected to the element second electrode 64 (source electrode) of the semiconductor element 6b via the wiring pattern 321 and the via holes 221. Accordingly, the third electrode 43 functions as a source terminal of the semiconductor element 6b. The fifth electrode 45 is electrically connected to the element third electrode 65 (gate electrode) of the semiconductor element 6a via the wiring pattern 322, the via hole 224, the fourth lead 14, the via hole 214, the wiring pattern 312, and the via hole 212. The fifth electrode 45 is also electrically connected to the element third electrode 65 (gate electrode) of the semiconductor element 6b via the wiring pattern 322 and the via hole 222. Accordingly, the fifth electrode 45 functions as a gate terminal of each of the semiconductor element 6a and the semiconductor element 6b. The semiconductor device A1 is a circuit in which the gate electrodes of the two semiconductor elements 6a and 6b are connected to each other.

The insulating films 8 are formed on the insulating-layer obverse surface 71 and the insulating-layer reverse surface 72, and covers the wiring patterns 311, 312, and 321 to 324. The insulating films 8 are provided to protect the wiring patterns 311, 312, and 321 to 324, and to electrically insulate the first electrode 41, the second electrode 42, the third electrode 43, and the fifth electrode 45 from each other. One of the insulating films 8 covers the entirety of the insulating-layer obverse surface 71 and the entirety of the wiring patterns 311 and 312. The other insulating film 8 covers the entirety of the insulating-layer reverse surface 72 and the entirety of the wiring patterns 321 to 324 except the portions where the first electrode 41, the second electrode 42, the third electrode 43, and the fifth electrode 45 are formed. The insulating films 8 are formed by photolithography, for example, with an insulating material such as a solder resist. The material, thickness, and forming method of the insulating films 8 are not particularly limited.

Figure 7:
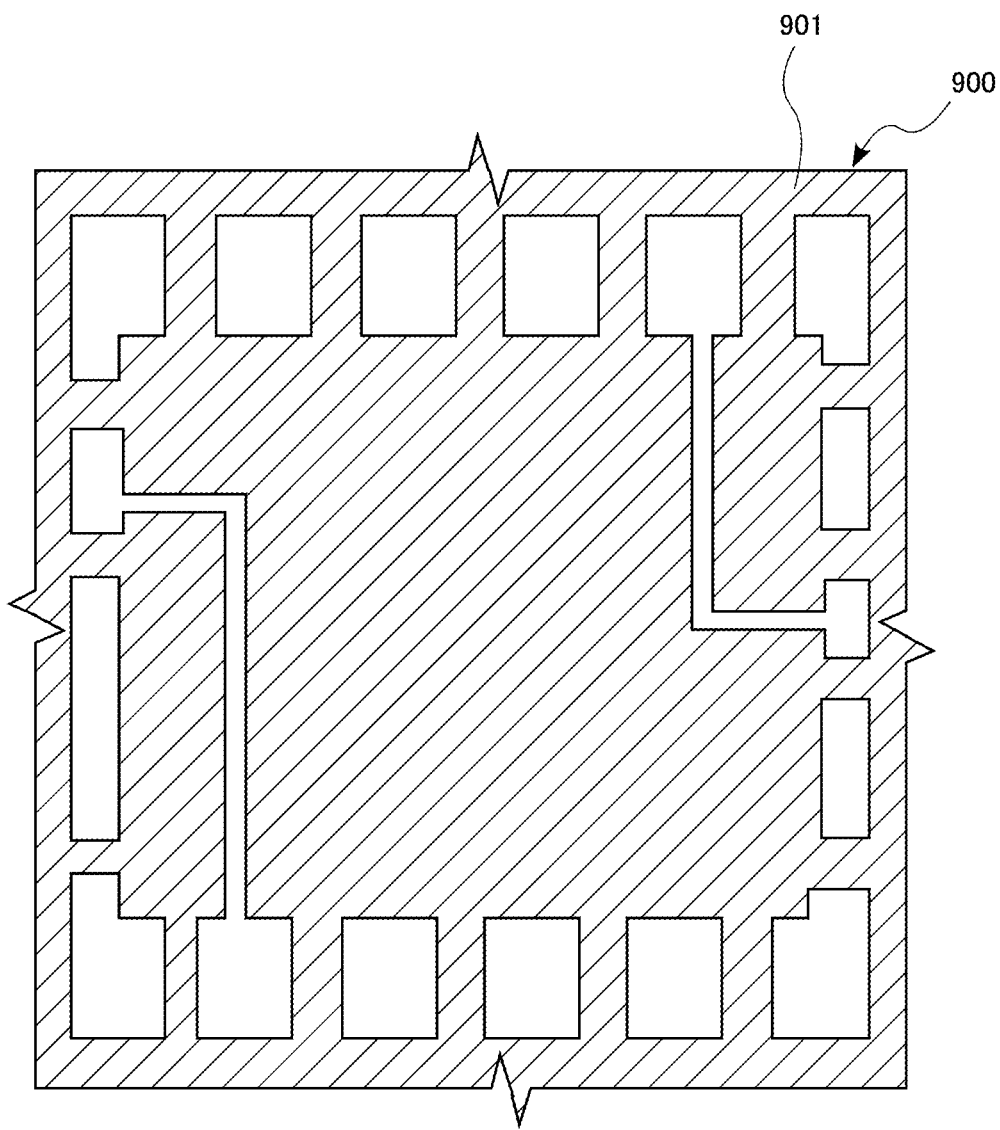
FIG. 7 is a plan view illustrating a manufacturing step of the semiconductor device of FIG. 1.

Next, an example of the method for manufacturing the semiconductor device A1 will be described with reference to FIGS. 7 to 14. FIG. 7 is a plan view corresponding to FIG. 5. FIGS. 8 to 14 are schematic cross-sectional views corresponding to FIG. 3.

First, a lead frame 900 is prepared as shown in FIG. 7. The lead frame 900 is a plate-like member from which the first lead 11, the third lead 13, and the fourth lead 14 will be formed. FIG. 7 shows only the regions that will be formed into a single first lead 11, a single third lead 13, and a single fourth lead 14. The lead frame 900 is formed by etching a metal plate. Alternatively, the lead frame 900 may be formed by stamping a metal plate. In FIG. 7, the lead frame 900 is hatched to facilitate understanding. The lead frame 900 has an obverse surface 901 and a reverse surface 902 that face opposite to each other in the z direction. The obverse surface 901 faces upward in FIG. 8, and will be formed into each of the obverse surface 111 of the first lead 11, the obverse surface 131 of the third lead 13, and the obverse surface 141 of the fourth lead 14. The reverse surface 902 faces downward in FIG. 8, and will be formed into each of the reverse surface 112 of the first lead 11, the reverse surface 132 of the third lead 13, and the reverse surface 142 of the fourth lead 14.

Figure 8:
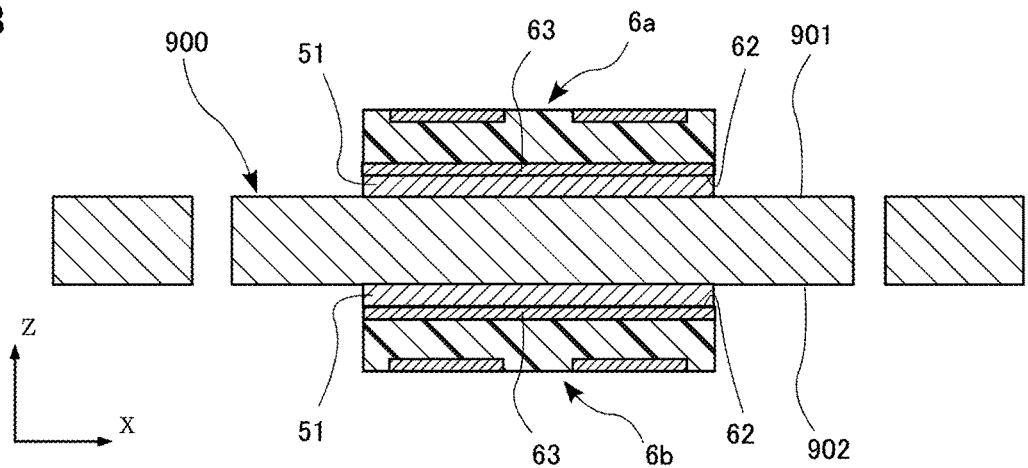
FIG. 8 is a plan view illustrating a manufacturing step of the semiconductor device of FIG. 1.

Next, as shown in FIG. 8, the semiconductor elements 6a and 6b are bonded to the lead frame 900. First, a Ag paste is applied to the center of a region that is one of the regions of the obverse surface 901 of the lead frame 900, and that will be formed into the obverse surface 111 of the first lead 11. Then, the semiconductor element 6a is bonded to the region with the element reverse surface 62 facing the obverse surface 901 of the lead frame 900. Next, a reflow process is performed. As a result of the reflow process, the Ag paste is thermally cured to become the conductive bonding layer 51, and the semiconductor element 6a is bonded to the lead frame 900 via the conductive bonding layer 51. At this point, the element first electrode 63 of the semiconductor element 6a is electrically connected to the lead frame 900 via the conductive bonding layer 51. Next, a Ag paste is applied to the center of a region that is one of the regions of the reverse surface 902 of the lead frame 900, and that will be formed into the reverse surface 112 of the first lead 11. Then, the semiconductor element 6b is bonded to the region with the element reverse surface 62 facing the reverse surface 902 of the lead frame 900. Next, a reflow process is performed. As a result of the reflow process, the Ag paste is thermally cured to become the conductive bonding layer 51, and the semiconductor element 6b is bonded to the lead frame 900 via the conductive bonding layer 51. At this point, the element first electrode 63 of the semiconductor element 6b is electrically connected to the lead frame 900 via the conductive bonding layer 51.

Figure 9:
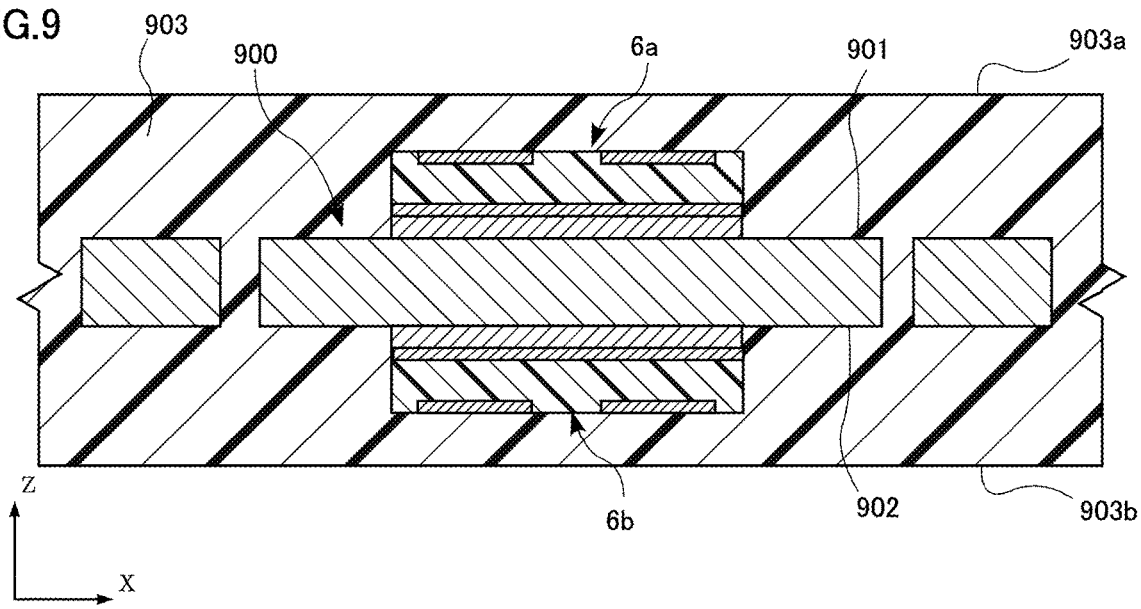
FIG. 9 is a schematic cross-sectional view illustrating a manufacturing step of the semiconductor device of FIG. 1.

Next, an insulating layer 903 is formed as shown in FIG. 9. In this step, sheet-like prepregs are adhered to and stacked on each of the obverse surface 901 and the reverse surface 902 of the lead frame 900, whereby the insulating layer 903 is formed to cover the lead frame 900 and the semiconductor elements 6a and 6b. The insulating layer 903 corresponds to the insulating layer 7. The insulating layer 903 has an obverse surface 903a and a reverse surface 903b that face opposite to each other in the z direction. The obverse surface 903a faces upward in FIG. 9, and will be formed into the insulating-layer obverse surface 71. The reverse surface 903b faces downward in FIG. 9, and will be formed into the insulating-layer reverse surface 72.

Figure 10:
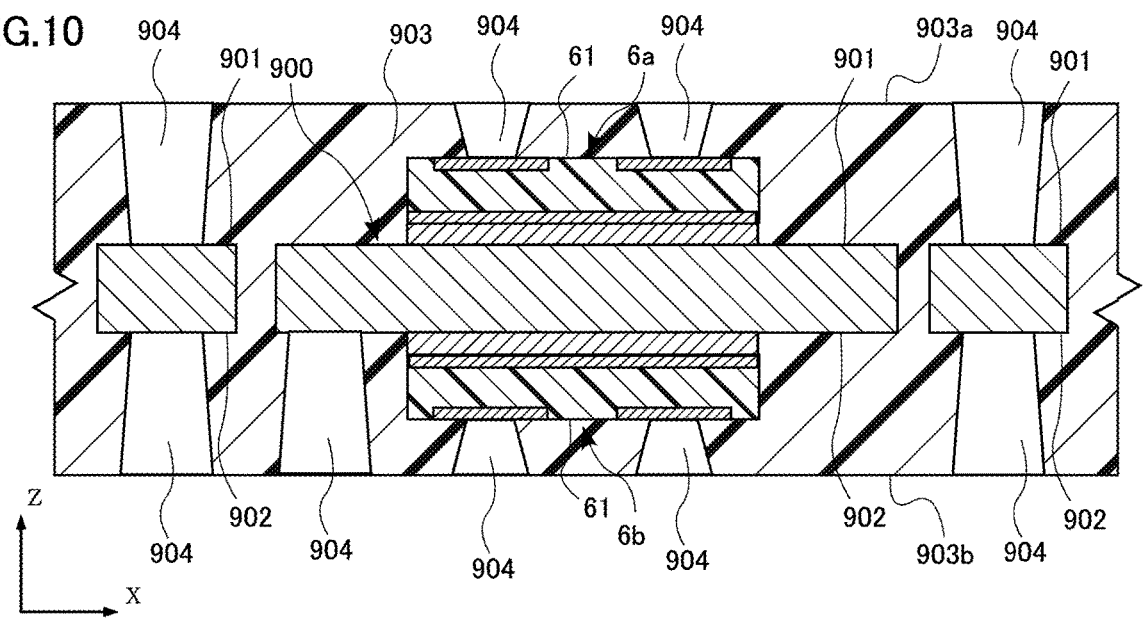
FIG. 10 is a schematic cross-sectional view illustrating a manufacturing step of the semiconductor device of FIG. 1.

Next, holes 904 are formed in the insulating layer 903 as shown in FIG. 10. In this process, a laser, for example, is used to form the holes 904 extending in the z direction from the obverse surface 903a of the insulating layer 903. Each of the holes 904 is formed to reach the obverse surface 901 of the lead frame 900 or the element obverse surface 61 of the semiconductor element 6a at a predetermined position. Next, a laser, for example, is used to form the holes 904 extending in the z direction from the reverse surface 903b of the insulating layer 903. Each of the holes 904 is formed to reach the reverse surface 902 of the lead frame 900 or the element obverse surface 61 of the semiconductor element 6b at a predetermined position.

Figure 11:
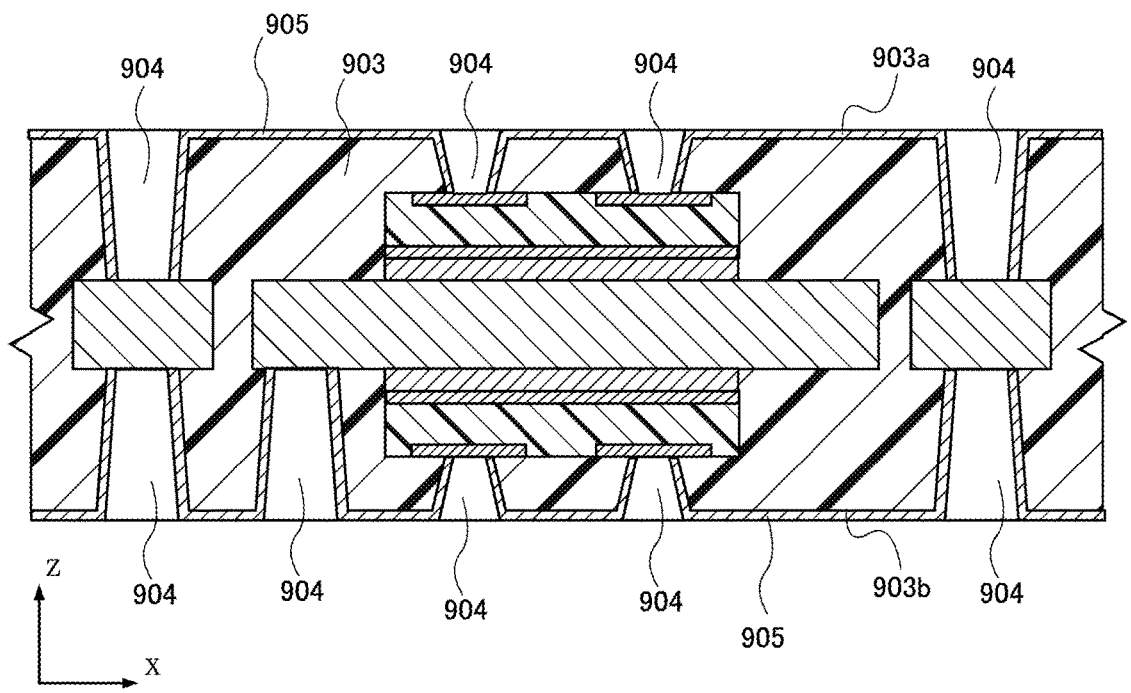
FIG. 11 is a schematic cross-sectional view illustrating a manufacturing step of the semiconductor device of FIG. 1.

Next, via holes and wiring patterns are formed. First, as shown in FIG. 11, an underlying layer 905, which is a thin Cu layer, is formed on each of the inner surfaces of the holes 904 and the entirety of each of the obverse surface 903a and the reverse surface 903b of the insulating layer 903 by electroless plating.

Figure 12:
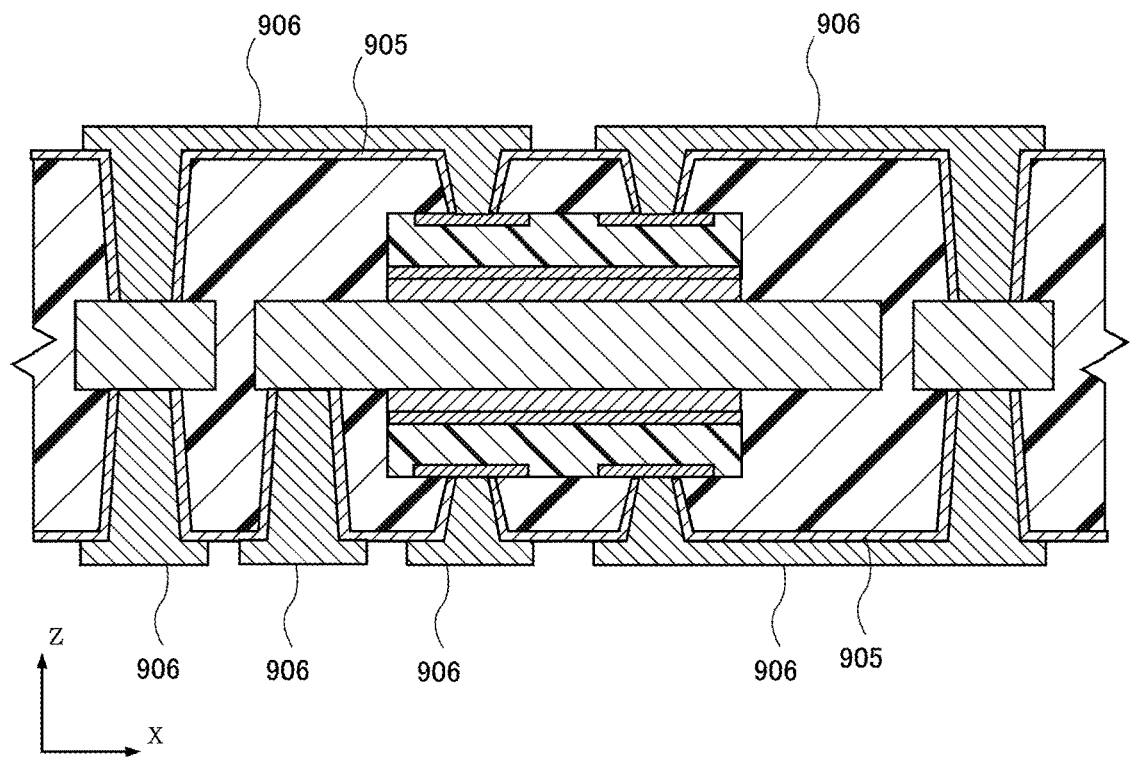
FIG. 12 is a schematic cross-sectional view illustrating a manufacturing step of the semiconductor device of FIG. 1.

Next, a photosensitive dry film is bonded to cover the entire surface of the underlying layer 905, and patterning is performed through exposure and development. As a result, the underlying layer 905 is exposed from portions where the photosensitive dry film is removed by exposure. Next, as shown in FIG. 12, a plating layer 906 is formed to be in contact with the exposed underlying layer 905. The plating layer 906 is made of Cu, and is formed by electroplating with the underlying layer 905 used as a conductive path.

Figure 13:
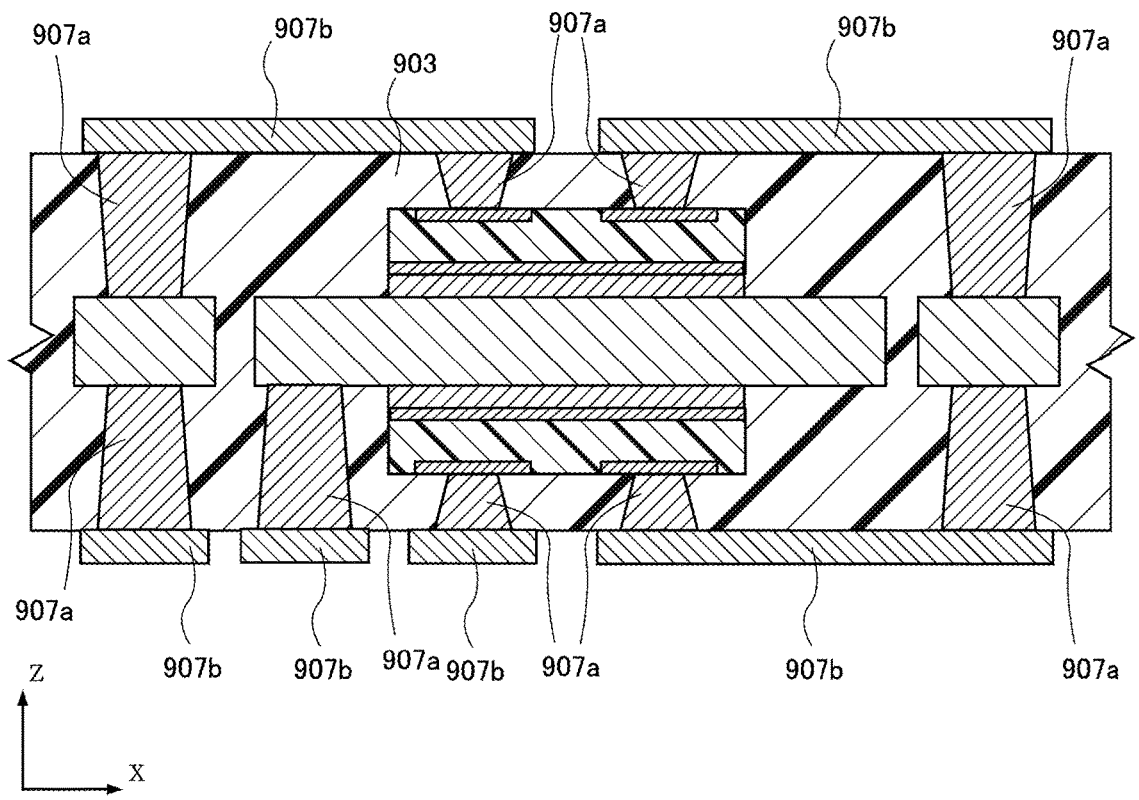
FIG. 13 is a schematic cross-sectional view illustrating a manufacturing step of the semiconductor device of FIG. 1.

Next, as shown in FIG. 13, unnecessary portions of the underlying layer 905, which are not covered with the plating layer 906, are completely removed. The unnecessary portions of the underlying layer 905 may be removed by wet etching. The insulating layer 903 is exposed from the portions where the underlying layer 905 is removed. The underlying layer 905 and the plating layer 906 that are stacked on each other are integrated. In the following description, the portions formed in the holes 904 are referred to as via holes 907a, and portions formed on the obverse surface 903a and the reverse surface 903b of the insulating layer 903 are referred to as wiring patterns 907b. The via holes 907a correspond to the via holes 211 to 214, and 221 to 225, and the wiring patterns 907b correspond to the wiring patterns 311, 312, and 321 to 324.

Figure 14:
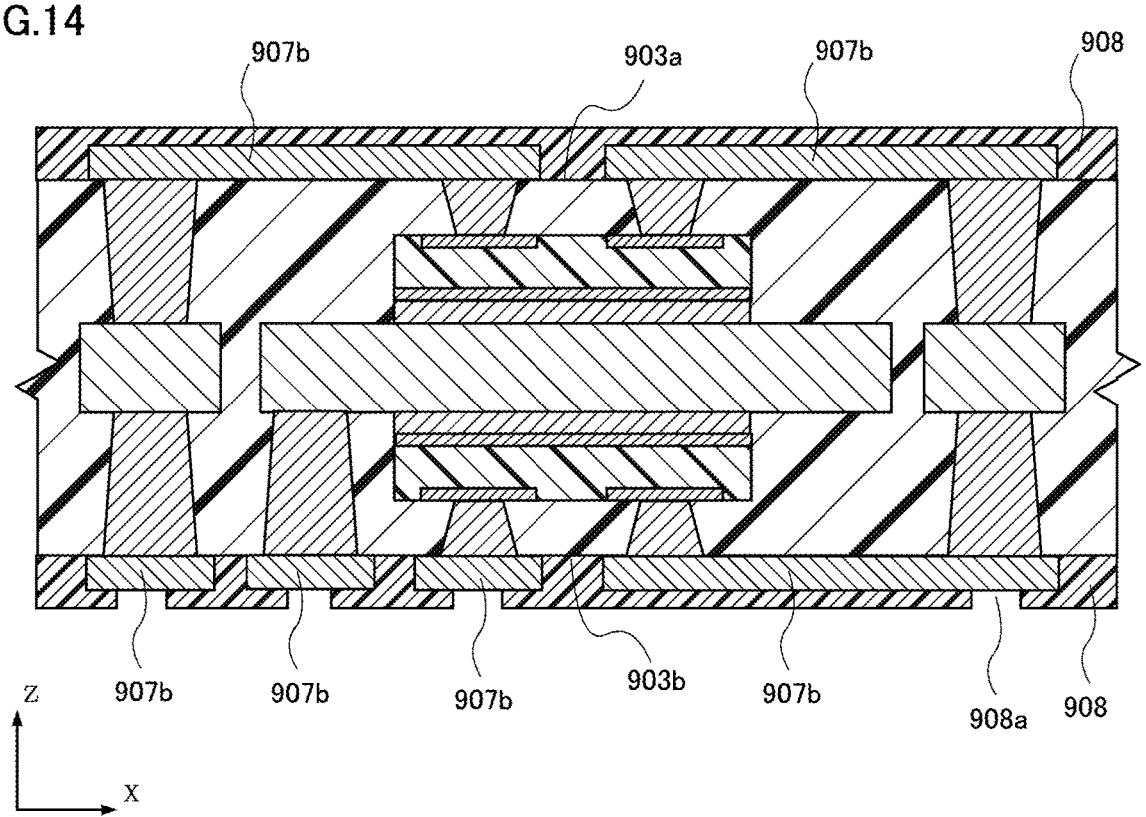
FIG. 14 is a schematic cross-sectional view illustrating a manufacturing step of the semiconductor device of FIG. 1.

Next, as shown in FIG. 14, insulating films 908 are formed to cover the obverse surface 903a and the reverse surface 903b of the insulating layer 903 and the wiring patterns 907b. In the present embodiment, the insulating films 908 are formed by photolithography. First, a solder resist is applied to cover the obverse surface 903a and the reverse surface 903b of the insulating layer 903 and the entirety of the wiring patterns 907b. Next, patterning is performed through exposure and development. As a result, one of the insulating films 908 is formed with openings 908a at predetermined positions. The insulating films 908 correspond to the insulating films 8.

Next, electrodes are formed in the respective openings 908a of the insulating film 908 by electroless plating. Next, the lead frame 900, the insulating layer 903, and the insulating films 908 are diced along cutting lines (not illustrated) that are each parallel to the x direction or the y direction. As a result of the dicing step, individual pieces are obtained, one of which serves as the semiconductor device A1. The semiconductor device A1 is obtained through the process as described above. The method for manufacturing the semiconductor device A1 is not limited to the one described above.

The following describes advantageous effects of the semiconductor device A1.

In the semiconductor device A1 according to the present embodiment, the semiconductor element 6a is mounted on the obverse surface 111 of the first lead 11, and the semiconductor element 6b is mounted on the reverse surface 112 of the first lead 11. Accordingly, the surface area (the area along the plane perpendicular to the z direction) of each of the semiconductor elements 6a and 6b can be relatively large as compared to the case where the semiconductor element 6a and the semiconductor element 6b are arranged side by side on the same surface of the first lead 11. This makes it possible to reduce the on-resistance of each of the semiconductor elements 6a and 6b, which are MOSFETs. Under the condition that the semiconductor elements 6a and 6b have the same surface areas, the semiconductor device A1 can be reduced in surface area as compared to the case where the semiconductor elements 6a and 6b are arranged side by side on the same surface.

According to the present embodiment, the element first electrode 63 of the semiconductor element 6a and the element first electrode 63 of the semiconductor element 6b are both electrically connected to the first lead 11. This makes it possible to form a common drain circuit in which the drain electrodes of the two semiconductor elements 6a and 6b are connected to each other.

Furthermore, according to the present embodiment, the fifth electrode 45 is electrically connected to the element third electrode 65 (gate electrode) of the semiconductor element 6a via the wiring pattern 322, the via hole 224, the fourth lead 14, the via hole 214, the wiring pattern 312, and the via hole 212, and also electrically connected to the element third electrode 65 (gate electrode) of the semiconductor element 6b via the wiring pattern 322 and the via hole 222. This makes it possible to simultaneously control the semiconductor element 6a and the semiconductor element 6b by inputting a control signal to the fifth electrode 45.

Figure 15:
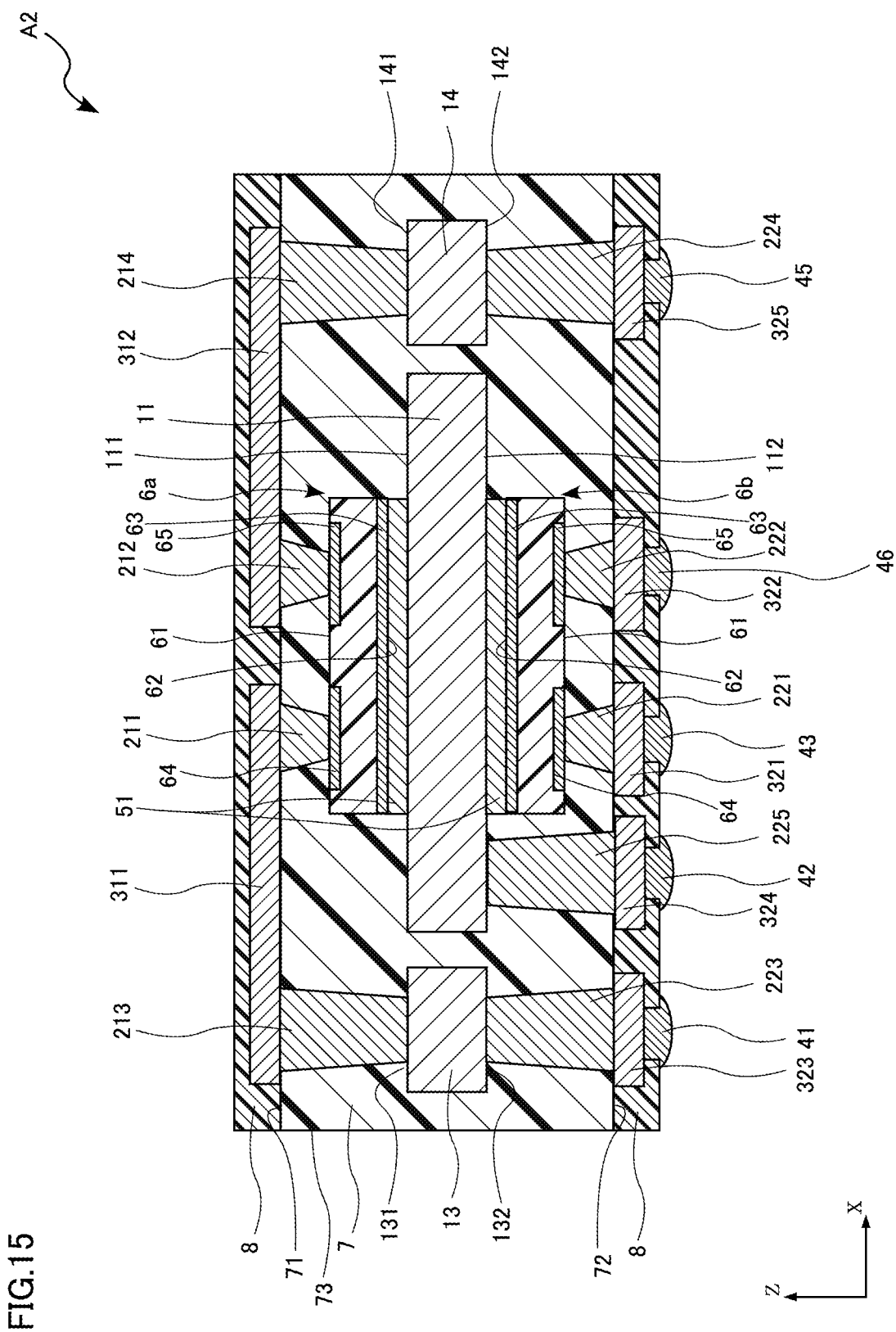
FIG. 15 is a schematic cross-sectional view showing a semiconductor device according to a second embodiment of the present disclosure.

The following describes a semiconductor device A2 according to a second embodiment of the present disclosure, with reference to FIG. 15. In FIG. 15, elements that are the same as or similar to those of the semiconductor device A1 are denoted by the same reference signs and descriptions thereof are omitted. FIG. 15 is a schematic cross-sectional view showing the semiconductor device A2, and corresponds to FIG. 3 that shows the semiconductor device A1 according to the first embodiment.

The semiconductor device A2 according to the present embodiment is different from the semiconductor device A1 according to the first embodiment in that the element third electrode 65 of the semiconductor element 6a and the element third electrode 65 of the semiconductor element 6b are not electrically connected to each other. The wiring pattern 322 according to the present embodiment is not in contact with the via hole 224. The semiconductor device A2 further includes a wiring pattern 325 and a sixth electrode 46.

The wiring pattern 325 is similar to any of the wiring patterns 321 to 324, and is formed on the insulating-layer reverse surface 72 with a separation from each of the wiring patterns 321 to 324. The wiring pattern 325 is in contact with the via hole 224 and the fifth electrode 45 and electrically connects the via hole 224 and the fifth electrode 45. The sixth electrode 46 is similar to the fifth electrode 45, and is in contact with and electrically connected to the wiring pattern 322. In the present embodiment, the fifth electrode 45 is electrically connected to the element third electrode 65 (gate electrode) of the semiconductor element 6a via the wiring pattern 325, the via hole 224, the fourth lead 14, the via hole 214, the wiring pattern 312, and the via hole 212, but is not electrically connected to the element third electrode 65 (gate electrode) of the semiconductor element 6b. On the other hand, the sixth electrode 46 is electrically connected to the element third electrode 65 (gate electrode) of the semiconductor element 6b via the wiring pattern 322 and the via hole 222. Accordingly, the fifth electrode 45 functions as a gate terminal of the semiconductor element 6a, and the sixth electrode 46 functions as a gate terminal of the semiconductor element 6b.

Again in the present embodiment, the semiconductor element 6a is mounted on the obverse surface 111 of the first lead 11, and the semiconductor element 6b is mounted on the reverse surface 112 of the first lead 11. Accordingly, the surface area (the area along the plane perpendicular to the z direction) of each of the semiconductor elements 6a and 6b can be relatively large as compared to the case where the semiconductor element 6a and the semiconductor element 6b are arranged side by side on the same surface of the first lead 11. Furthermore, according to the present embodiment, the element first electrode 63 of the semiconductor element 6a and the element first electrode 63 of the semiconductor element 6b are also both electrically connected to the first lead 11. This makes it possible to form a common drain circuit in which the drain electrodes of the two semiconductor elements 6a and 6b are connected to each other.

According to the present embodiment, the fifth electrode 45 is electrically connected to the element third electrode 65 (gate electrode) of the semiconductor element 6a, and the sixth electrode 46 is electrically connected to the element third electrode 65 (gate electrode) of the semiconductor element 6b. However, the fifth electrode 45 and the sixth electrode 46 are not electrically connected to each other. This makes it possible to individually control the semiconductor element 6a and the semiconductor element 6b by inputting different control signals to the fifth electrode 45 and the sixth electrode 46.

Note that the semiconductor device A2 may not include any of the wiring patterns 321 to 325, the first electrode 41 may be directly connected to the via hole 223, the second electrode 42 may be directly connected to the via hole 225, the third electrode 43 may be directly connected to the via holes 221, the fifth electrode 45 may be directly connected to the via hole 224, and the sixth electrode 46 may be directly connected to the via hole 222. In this case, there is no need to form the wiring patterns 321 to 325 on the insulating-layer reverse surface 72, thus reducing the quantity of materials for forming a wiring pattern.

Figure 16:
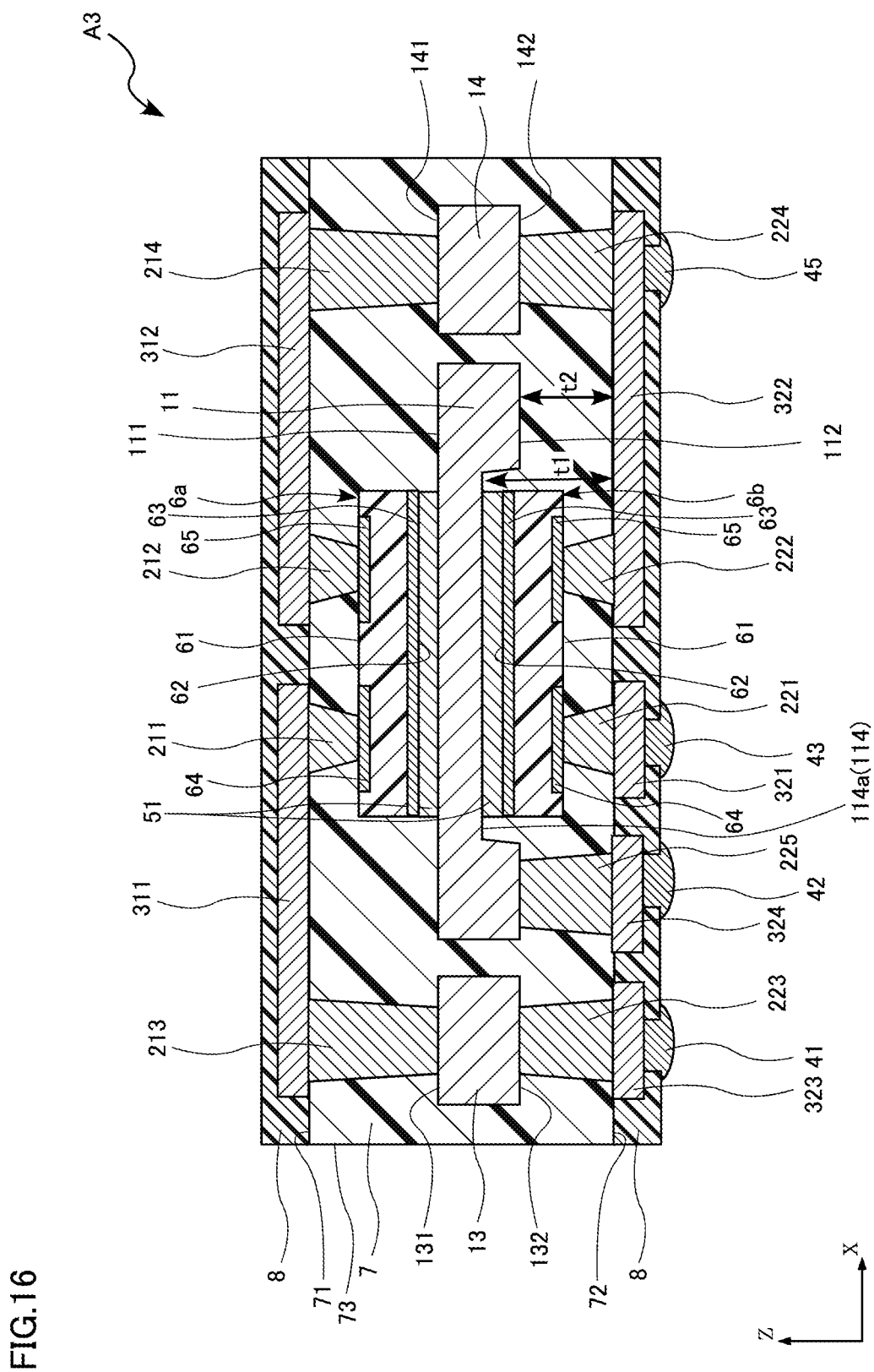
FIG. 16 is a schematic cross-sectional view showing a semiconductor device according to a third embodiment of the present disclosure.

The following describes a semiconductor device A3 according to a third embodiment of the present disclosure, with reference to FIG. 16. In FIG. 16, elements that are the same as or similar to those of the semiconductor device A1 are denoted by the same reference signs and descriptions thereof are omitted. FIG. 16 is a schematic cross-sectional view showing the semiconductor device A3, and corresponds to FIG. 3 that shows the semiconductor device A1 according to the first embodiment.

The semiconductor device A3 according to the present embodiment is different from the semiconductor device A1 according to the first embodiment in that the reverse surface 112 of the first lead 11 has a recess 114, and the semiconductor element 6b is arranged in the recess 114.

The recess 114 is formed in the reverse surface 112 of the first lead 11, is recessed toward the obverse surface 111, and has a bottom surface 114a parallel to the reverse surface 112. The recess 114 is formed by half-etching, for example. The semiconductor element 6b is arranged in the recess 114 and bonded to the first lead 11 via the conductive bonding layer 51, with the element reverse surface 62 and the bottom surface 114a facing each other.

Again in the present embodiment, the semiconductor element 6a is mounted on the obverse surface 111 of the first lead 11, and the semiconductor element 6b is mounted on the reverse surface 112 of the first lead 11. Accordingly, the surface area (the area along the plane perpendicular to the z direction) of each of the semiconductor elements 6a and 6b can be relatively large as compared to the case where the semiconductor element 6a and the semiconductor element 6b are arranged side by side on the same surface of the first lead 11.

Further, according to the present embodiment, the semiconductor element 6b is arranged on the bottom surface 114a of the recess 114 formed in the reverse surface 112 of the first lead 11. Accordingly, when the distance t1 from the bottom surface 114a to the insulating-layer reverse surface 72 is the same as the distance from the reverse surface 112 to the insulating-layer reverse surface 72 in the first embodiment, the thickness (the dimension in the z direction) of the semiconductor device A3 is smaller than that of the semiconductor device A1. In other words, this allows the semiconductor device to be made thinner. Furthermore, since the distance t2 from the reverse surface 112 to the insulating-layer reverse surface 72 is smaller than that in the first embodiment, the height (the dimension in the z direction) of each of the via holes 223 to 225 is smaller than that in the first embodiment. As a result, the resistance values of the via holes 223 to 225 are reduced. It is also possible to reduce the amount of material for forming the via holes 223 to 225. Furthermore, the depth of the holes drilled from the insulating-layer reverse surface 72 in order to form the via holes 223 to 225 can be smaller. This suppresses defects caused by the drilling.

Note that the semiconductor device A3 may have a recess 115 in the obverse surface 111 instead of having the recess 114 in the reverse surface 112. In this case, the recess 115 is formed in the obverse surface 111 of the first lead 11, is recessed toward the reverse surface 112, and has a bottom surface 115a parallel to the obverse surface 111. The semiconductor element 6a is arranged in the recess 115 and bonded to the first lead 11 via the conductive bonding layer 51 with the element reverse surface 62 and the bottom surface 115a facing each other. In this modification, when the distance from the bottom surface 115a to the insulating-layer obverse surface 71 is the same as the distance from the obverse surface 111 to the insulating-layer obverse surface 71 in the first embodiment, the thickness (the dimension in the z direction) of the semiconductor device A3 is smaller than that of the semiconductor device A1. In other words, this allows the semiconductor device to be made thinner. Furthermore, since the distance from the obverse surface 111 to the insulating-layer obverse surface 71 is smaller than that in the first embodiment, the height (the dimension in the z direction) of each of the via holes 213 and 214 is smaller than that in the first embodiment. Accordingly, the depths of the holes drilled from the insulating-layer obverse surface 71 in order to form the via holes 213 and 214 can be smaller. This reduces time required for the drilling step. It is also possible to reduce the amount of material for forming the via holes 213 and 214. Note that in the semiconductor device A3, the reverse surface 112 may have the recess 114 in which the semiconductor element 6b is arranged, and the obverse surface 111 may have the recess 115 in which the semiconductor element 6a is arranged.

Figure 17:
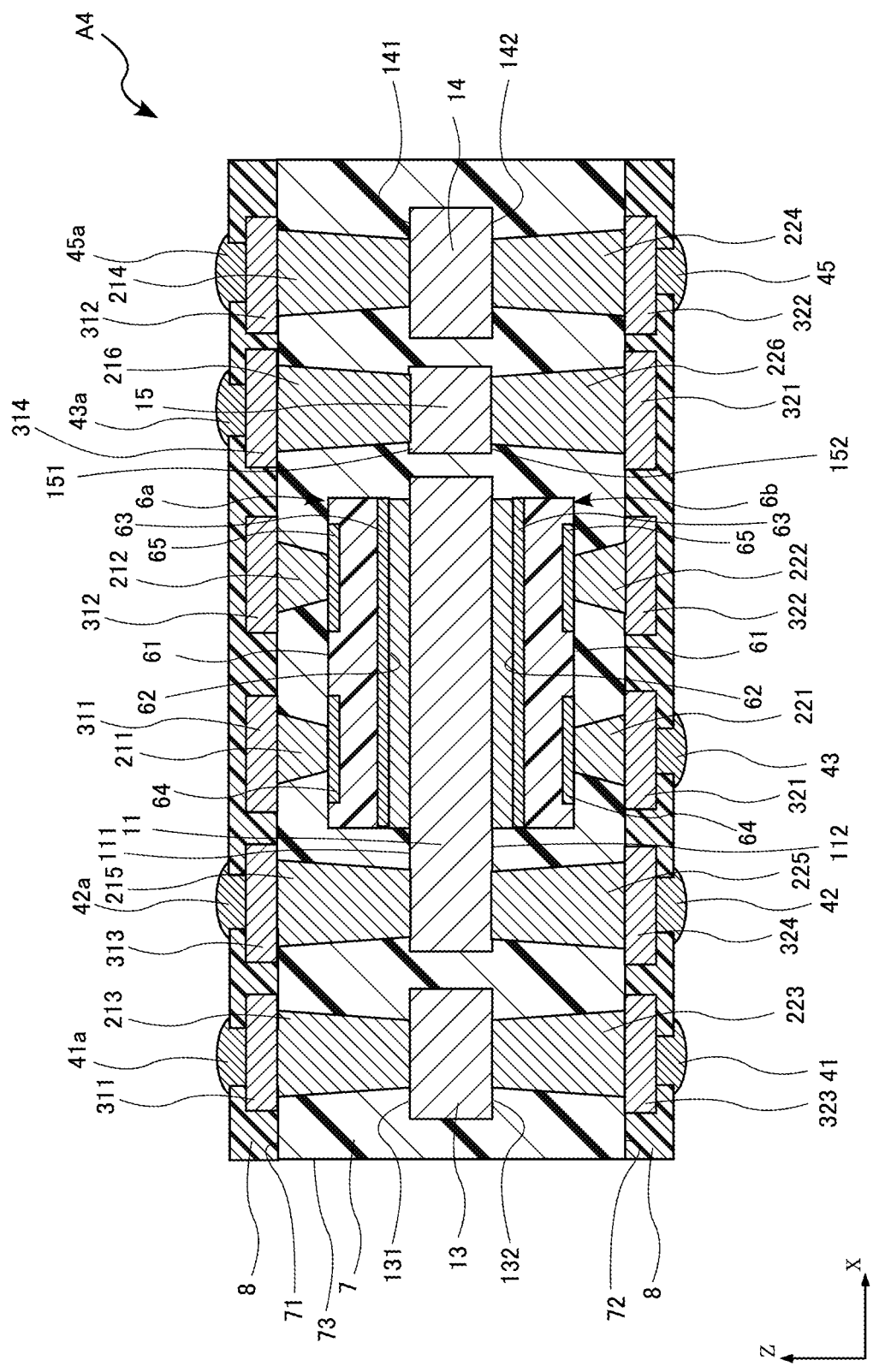
FIG. 17 is a schematic cross-sectional view showing a semiconductor device according to a fourth embodiment of the present disclosure.

The following describes a semiconductor device A4 according to a fourth embodiment of the present disclosure, with reference to FIG. 17. In FIG. 17, elements that are the same as or similar to those of the semiconductor device A1 are denoted by the same reference signs and descriptions thereof are omitted. FIG. 17 is a schematic cross-sectional view showing the semiconductor device A4, and corresponds to FIG. 3 that shows the semiconductor device A1 according to the first embodiment.

The semiconductor device A4 according to the present embodiment is different from the semiconductor device A1 according to the first embodiment in that the electrodes are formed not only in the reverse surface but also in the obverse surface (on the insulating-layer obverse surface 71 of the insulating layer 7). The semiconductor device A4 further includes a fifth lead 15, via holes 215, 216, and 226, wiring patterns 313 and 314, a first electrode 41a, a second electrode 42a, a third electrode 43a, and a fifth electrode 45a.

The fifth lead 15 is similar to the fourth lead 14 and spaced apart from the first lead 11, the third lead 13, and the fourth lead 14. The fifth lead 15 has an obverse surface 151, a reverse surface 152, and an end surface 153 (not illustrated). The obverse surface 151 and the reverse surface 152 face opposite to each other in the z direction. The obverse surface 151 faces upward in FIG. 17. The reverse surface 152 faces downward in FIG. 17. The end surface 153 is a cut surface formed by cutting a tie bar that connects the fifth lead 15 and the frame in the lead frame. The end surface 153 is exposed from the insulating layer 7. As shown in FIG. 17, the obverse surface 151 of the fifth lead 15 is flush with the obverse surface 111 of the first lead 11, the obverse surface 131 of the third lead 13, and the obverse surface 141 of the fourth lead 14. Furthermore, the reverse surface 152 of the fifth lead 15 is flush with the reverse surface 112 of the first lead 11, the reverse surface 132 of the third lead 13, and the reverse surface 142 of the fourth lead 14.

The via holes 215 and 216 are similar to any of the via holes 211 to 214, are open to the insulating-layer obverse surface 71 of the insulating layer 7, and extend in the z direction. As shown in FIG. 17, the via hole 215 is in contact with the obverse surface 111 of the first lead 11 and electrically connected to the first lead 11. The via hole 216 is in contact with the obverse surface 151 of the fifth lead 15 and electrically connected to the fifth lead 15. The via hole 226 is similar to any of the via holes 221 to 225, is open to the insulating-layer reverse surface 72 of the insulating layer 7, and extends in the z direction. As shown in FIG. 17, the via hole 226 is in contact with the reverse surface 152 of the fifth lead 15 and electrically connected to the fifth lead 15.

The wiring patterns 313 and 314 are similar to the wiring patterns 311 and 312, and are formed on the insulating-layer obverse surface 71 with a separation from the wiring patterns 311 and 312. As shown in FIG. 17, the wiring pattern 313 is in contact with and electrically connected to the via hole 215. The wiring pattern 314 is in contact with and electrically connected to the via hole 216. Although not shown in FIG. 17, the wiring pattern 311 has a portion that is in contact with the via holes 211, and a portion that is in contact with the via hole 213, and these portions are connected to each other on the insulating-layer obverse surface 71. Similarly, the wiring pattern 312 has a portion that is in contact with the via hole 212, and a portion that is in contact with the via hole 214, and these portions are connected to each other on the insulating-layer obverse surface 71. Although not shown in FIG. 17, the wiring pattern 321 has a portion that is in contact with the via holes 221, and a portion that is in contact with the via hole 226, and these portions are connected to each other on the insulating-layer reverse surface 72. Similarly, the wiring pattern 322 has a portion that is in contact with the via hole 222, and a portion that is in contact with the via hole 224, and these portions are connected to each other on the insulating-layer reverse surface 72.

The first electrode 41a, the second electrode 42a, the third electrode 43a, and the fifth electrode 45a are similar to the first electrode 41, the second electrode 42, the third electrode 43, and the fifth electrode 45, and arranged on the obverse surface of the semiconductor device A41. The first electrode 41a is in contact with and electrically connected to the wiring pattern 311. The second electrode 42a is in contact with and electrically connected to the wiring pattern 313. The third electrode 43a is in contact with and electrically connected to the wiring pattern 314. The fifth electrode 45a is in contact with and electrically connected to the wiring pattern 312. The first electrode 41a is electrically connected to the wiring pattern 311, which allows the first electrode 41a to be electrically connected to the first electrode 41 and function as a source terminal of the semiconductor element 6a. The second electrode 42a is electrically connected to the first lead 11 via the wiring pattern 313 and the via hole 215. Accordingly, the second electrode 42a is electrically connected to the second electrode 42, and functions as a drain terminal of each of the semiconductor element 6a and the semiconductor element 6b. The third electrode 43a is electrically connected to the wiring pattern 321 via the wiring pattern 314, the via hole 216, the fifth lead 15, and the via hole 226. Accordingly, the third electrode 43a is electrically connected to the third electrode 43, and functions as a source terminal of the semiconductor element 6b. The fifth electrode 45a is electrically connected to the wiring pattern 312, which allows the fifth electrode 45a to be electrically connected to the fifth electrode 45 and function as a gate terminal of each of the semiconductor element 6a and the semiconductor element 6b.

Again in the present embodiment, the semiconductor element 6a is mounted on the obverse surface 111 of the first lead 11, and the semiconductor element 6b is mounted on the reverse surface 112 of the first lead 11. Accordingly, the surface area (the area along the plane perpendicular to the z direction) of each of the semiconductor elements 6a and 6b can be relatively large as compared to the case where the semiconductor element 6a and the semiconductor element 6b are arranged side by side on the same surface of the first lead 11. Furthermore, according to the present embodiment, the first electrode 41a, the second electrode 42a, the third electrode 43a, and the fifth electrode 45a are arranged on the obverse surface of the semiconductor device A4. Since the electrodes are arranged both on the obverse surface and the reverse surface, the degree of freedom when mounting on a circuit board is increased. For example, it is possible to mount a passive element on the obverse surface of the semiconductor device A4. Note that the first electrode 41a, the second electrode 42a, the third electrode 43a, and the fifth electrode 45a may not all be arranged, but only the necessary ones among them may be arranged instead. Similarly, it is not absolutely necessary to arrange all of the first electrode 41, the second electrode 42, the third electrode 43, and the fifth electrode 45.

Figure 18:
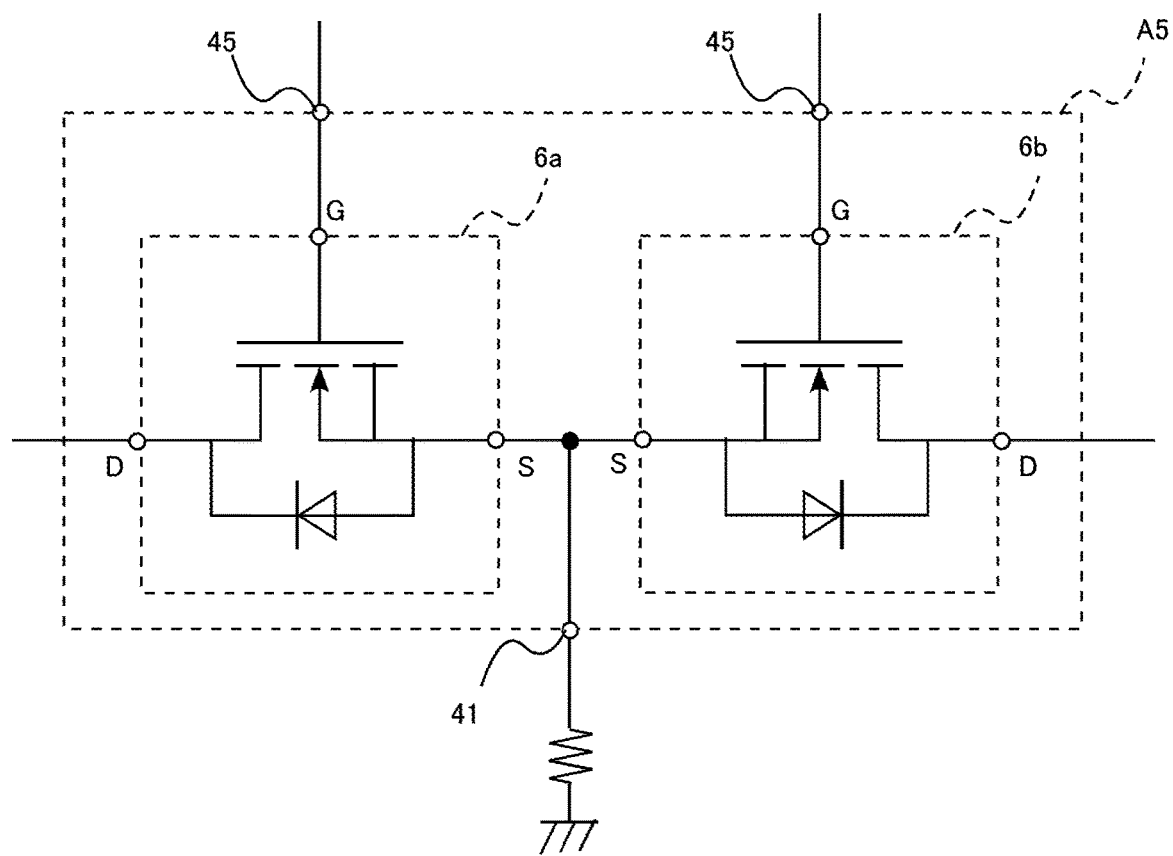
FIG. 18 is a circuit diagram showing a semiconductor device according to a fifth embodiment of the present disclosure.
Figure 19:
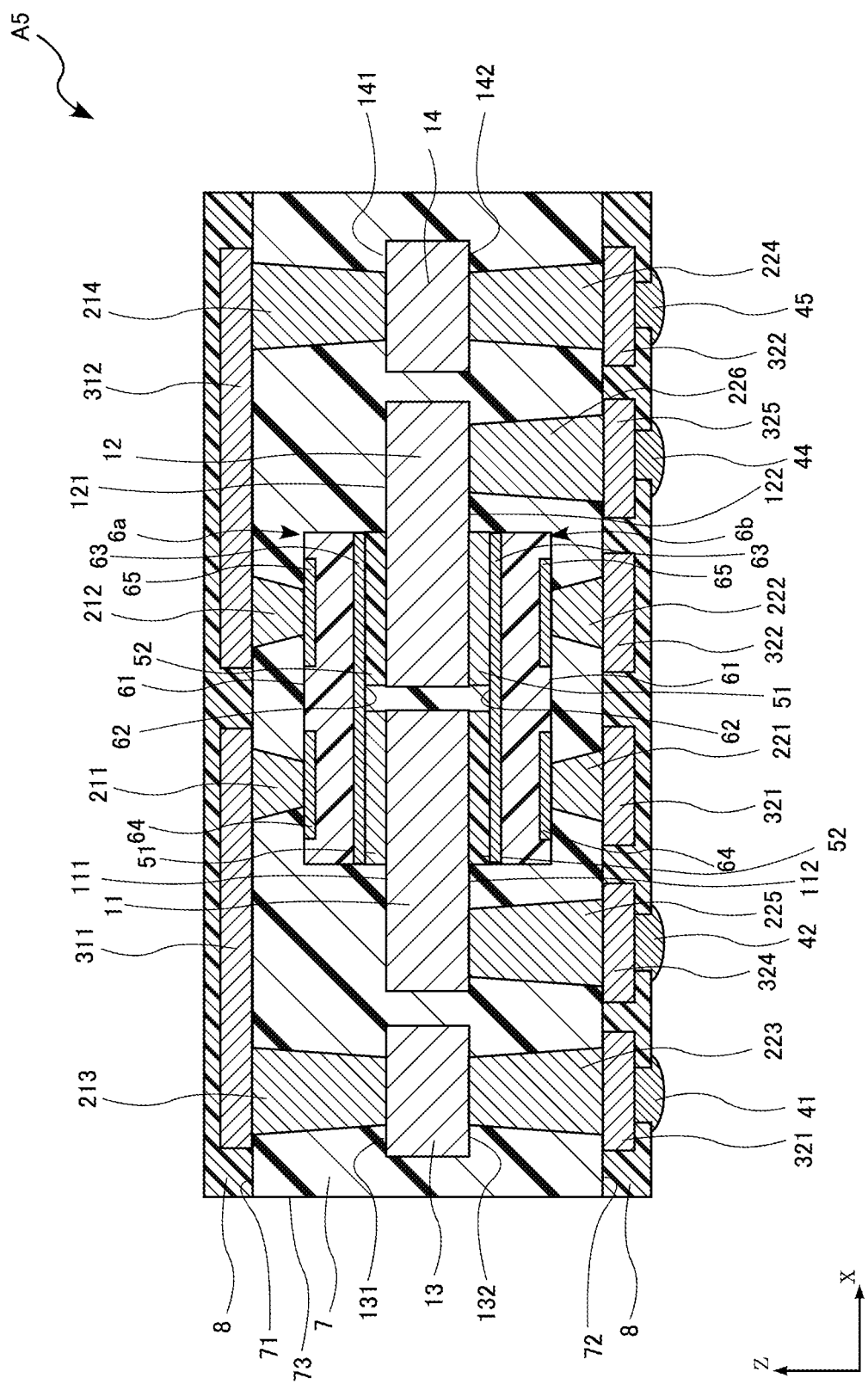
FIG. 19 is a schematic cross-sectional view showing the semiconductor device of FIG. 18.
Figure 20:
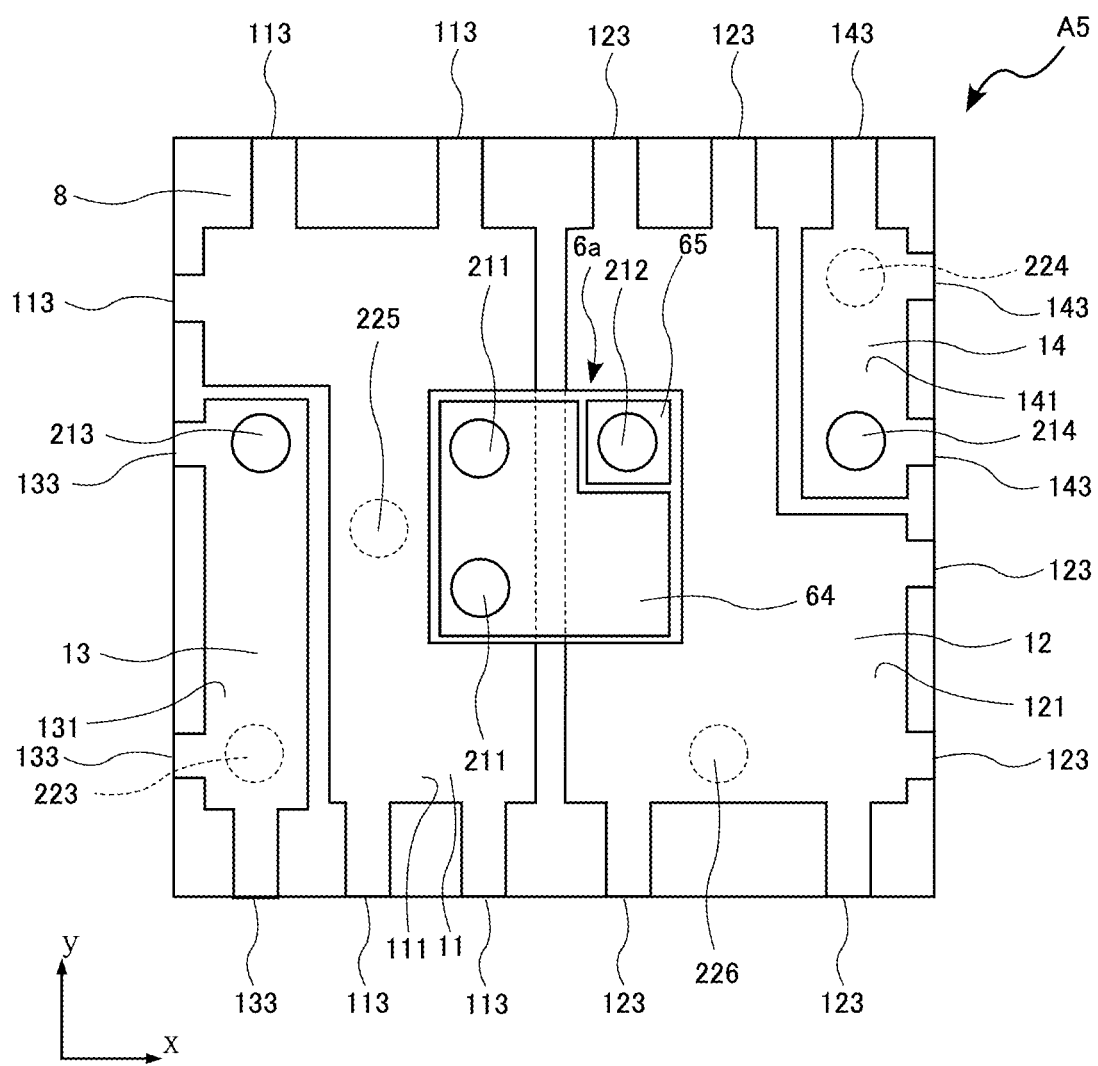
FIG. 20 is a plan view showing a portion of the semiconductor device of FIG. 18 as transparent.
Figure 21:
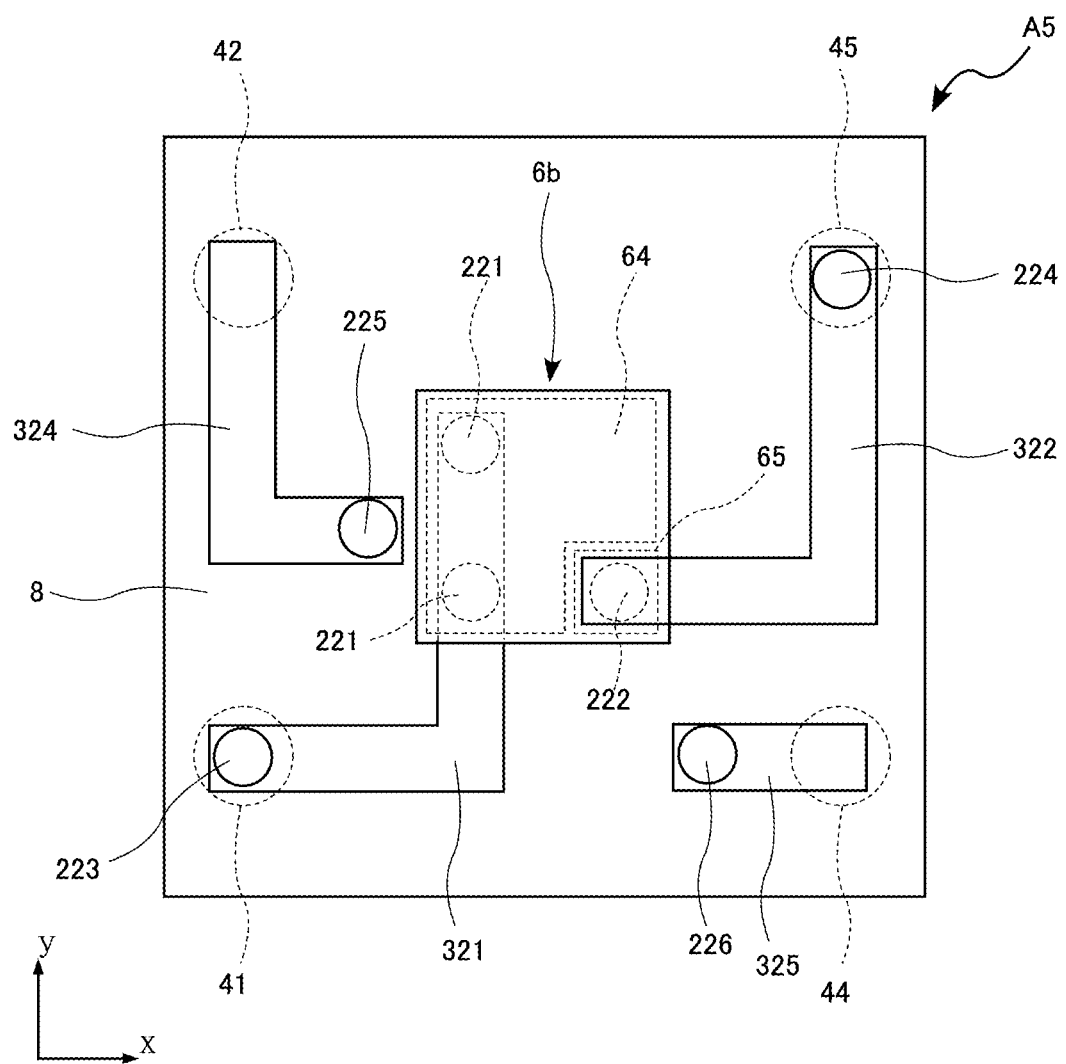
FIG. 21 is a plan view showing a portion of the semiconductor device of FIG. 18 as transparent.

The following describes a semiconductor device A5 according to a fifth embodiment of the present disclosure, with reference to FIGS. 18 to 21. In FIGS. 18 to 21, elements that are the same as or similar to those of the semiconductor device A1 are denoted by the same reference signs and descriptions thereof are omitted. FIG. 18 is a circuit diagram showing the semiconductor device A5, and corresponds to FIG. 2 that shows the semiconductor device A1 according to the first embodiment. FIG. 19 is a schematic cross-sectional view showing the semiconductor device A5, and corresponds to FIG. 3 that shows the semiconductor device A1 according to the first embodiment. FIGS. 20 and 21 are plan views of the semiconductor device A5, showing a portion of the semiconductor device A5 as transparent. FIG. 20 corresponds to FIG. 5 that shows the semiconductor device A1 according to the first embodiment. FIG. 21 corresponds to FIG. 6 that shows the semiconductor device A1 according to the first embodiment. Note that a figure corresponding to FIG. 4 that shows the semiconductor device A1 according to the first embodiment is omitted here since the figure will be identical to FIG. 4.

The semiconductor device A5 according to the present embodiment is different from the semiconductor device A1 according to the first embodiment in that the semiconductor device A5 is a common source circuit (see FIG. 18) in which the source electrodes of the two semiconductor elements 6a and 6b are connected to each other, instead of the common drain circuit in which the drain electrodes are connected to each other. As shown in FIGS. 19 to 22, the semiconductor device A5 further includes a second lead 12, insulating bonding layers 52, a via hole 226, a wiring pattern 325, and a fourth electrode 44.

As shown in FIG. 20, the first lead 11 according to the present embodiment is arranged at the center of the semiconductor device A5 in the y direction and offset to one side (left in FIG. 20) from the center in the x direction, as viewed in the z direction. The first lead 11 supports the semiconductor elements 6a and 6b, and is electrically connected to the semiconductor element 6a but not to the semiconductor element 6b.

The second lead 12 is similar to the first lead 11 and spaced apart from the first lead 11, the third lead 13, and the fourth lead 14. As shown in FIG. 20, the second lead 12 is arranged at the center of the semiconductor device A5 in the y direction and offset to the other side (right in FIG. 20) from the center in the x direction, as viewed in the z direction. In other words, the first lead 11 and the second lead 12 according to the present embodiment correspond to two leads obtained by dividing the first lead 11 according to the first embodiment into two at the center in the x direction. The second lead 12 supports the semiconductor elements 6a and 6b, and is electrically connected to the semiconductor element 6b but not to the semiconductor element 6a. The arrangement, shape, and size of each of the first lead 11, the second lead 12, the third lead 13, and the fourth lead 14 are not limited to the above example, and may be designed as appropriate. The second lead 12 has an obverse surface 121, a reverse surface 122, and end surfaces 123. The obverse surface 121 and the reverse surface 122 face opposite to each other in the z direction. The obverse surface 121 faces upward in FIG. 19. The obverse surface 121 is a surface on which the semiconductor element 6a is mounted. The reverse surface 122 faces downward in FIG. 19. The reverse surface 122 is a surface on which the semiconductor element 6b is mounted. Each of the end surfaces 123 is a cut surface formed by cutting a tie bar that connects the second lead 12 and the frame in the lead frame. The end surfaces 123 are exposed from the insulating layer 7. As shown in FIG. 19, the obverse surface 121 of the second lead 12 is flush with the obverse surface 111 of the first lead 11, the obverse surface 131 of the third lead 13, and the obverse surface 141 of the fourth lead 14. Furthermore, the reverse surface 122 of the second lead 12 is flush with the reverse surface 112 of the first lead 11, the reverse surface 132 of the third lead 13, and the reverse surface 142 of the fourth lead 14.

As shown in FIG. 19, the semiconductor elements 6a and 6b according to the present embodiment are mounted over the first lead 11 and the second lead 12. The semiconductor element 6a is bonded to the first lead 11 via the conductive bonding layer 51 and to the second lead 12 via the insulating bonding layer 52, with the element reverse surface 62 facing each of the obverse surface 111 and the obverse surface 121. As such, the element first electrode 63 of the semiconductor element 6a is electrically connected to the first lead 11 via the conductive bonding layer 51. On the other hand, the element first electrode 63 of the semiconductor element 6a is not electrically connected to the second lead 12 since the insulating bonding layer 52 is interposed between the element first electrode 63 of the semiconductor element 6a and the second lead 12. The semiconductor element 6b is bonded to the second lead 12 via the conductive bonding layer 51 and to the first lead 11 via the insulating bonding layer 52, with the element reverse surface 62 facing each of the reverse surface 112 and the reverse surface 122. As such, the element first electrode 63 of the semiconductor element 6b is electrically connected to the second lead 12 via the conductive bonding layer 51. On the other hand, the element first electrode 63 of the semiconductor element 6b is not electrically connected to the first lead 11 since the insulating bonding layer 52 is interposed between the element first electrode 63 of the semiconductor element 6b and the first lead 11.

As shown in FIG. 19, the insulating bonding layers 52 are insulators, one of which is interposed between the semiconductor element 6a and the second lead 12 and the other between the semiconductor element 6b and the first lead 11. The semiconductor elements 6a and 6b are bonded to the first lead 11 and the second lead 12, respectively, via the conductive bonding layers 51 and the insulating bonding layers 52. The conductive bonding layers 51 ensure that the element first electrode 63 of the semiconductor element 6a is electrically connected to the first lead 11, and that the element first electrode 63 of the semiconductor element 6b is electrically connected to the second lead 12. On the other hand, the insulating bonding layers 52 ensure that the element first electrode 63 of the semiconductor element 6a is insulated from the second lead 12, and that the element first electrode 63 of the semiconductor element 6b is insulated from the first lead 11. The insulating bonding layers 52 are formed by applying and thermally curing an insulating bonding material. The insulating bonding material is a solder resist, for example. Note that a material other than the solder resist, such as a synthetic resin, may be used as the insulating bonding material. The method for forming the insulating bonding layers 52 is not particularly limited as long as the insulating bonding layers 52 are made of an insulating material.

The via hole 226 is similar to any of the via holes 221 to 225, is open to the insulating-layer reverse surface 72 of the insulating layer 7, and extends in the z direction. As shown in FIGS. 19 and 20, the via hole 226 is in contact with the reverse surface 122 of the second lead 12 and electrically connected to the second lead 12.

The wiring pattern 325 is similar to any of the wiring patterns 321, 322, and 324, and is formed on the insulating-layer reverse surface 72 with a separation from the wiring patterns 321, 322, and 324. As shown in FIGS. 19 and 21, the wiring pattern 325 is in contact with and electrically connected to the via hole 226. As shown in FIG. 21, according to the present embodiment, the wiring pattern 323 is not formed, and the wiring pattern 321 is in contact with and electrically connected to the via hole 223. In FIG. 19, a portion of the wiring pattern 321 that is in contact with the via holes 221 and a portion of the wiring pattern 321 that is in contact with the via hole 223 are shown to be spaced apart from each other, but these portions are actually connected to each other on the insulating-layer reverse surface 72 as shown in FIG. 21. Similarly, a portion of the wiring pattern 322 that is in contact with the via hole 222 and a portion of the wiring pattern 322 that is in contact with the via hole 224 are connected to each other on the insulating-layer reverse surface 72.

The fourth electrode 44 is similar to any of the first electrode 41, the second electrode 42, the third electrode 43, and the fifth electrode 45, and is arranged on the reverse surface of the semiconductor device A5. As shown in FIGS. 19 and 21, the fourth electrode 44 is in contact with and electrically connected to the wiring pattern 325. The fourth electrode 44 is electrically connected to the element first electrode 63 (drain electrode) of the semiconductor element 6b via the wiring pattern 325, the via hole 226, and the second lead 12. Accordingly, the fourth electrode 44 functions as a drain terminal of the semiconductor element 6b.

The second electrode 42 is electrically connected to the element first electrode 63 (drain electrode) of the semiconductor element 6a via the wiring pattern 324, the via hole 225, and the first lead 11. Accordingly, the second electrode 42 functions as a drain terminal of the semiconductor element 6a. In other words, in the present embodiment, the drain electrodes of the two semiconductor elements 6a and 6b are not common unlike the case in the first embodiment.

The first electrode 41 is electrically connected to the element second electrode 64 (source electrode) of the semiconductor element 6a via the wiring pattern 321, the via hole 223, the third lead 13, the via hole 213, the wiring pattern 311, and the via holes 211. The first electrode 41 is also electrically connected to the element second electrode 64 (source electrode) of the semiconductor element 6b via the wiring pattern 321 and the via holes 221. Accordingly, the first electrode 41 functions as a source terminal of each of the semiconductor element 6a and the semiconductor element 6b. The semiconductor device A5 is a common source circuit (see FIG. 18) in which the source electrodes of the two semiconductor elements 6a and 6b are connected to each other.

Again in the present embodiment, the semiconductor element 6a is mounted on the obverse surface 111 of the first lead 11, and the semiconductor element 6b is mounted on the reverse surface 112 of the first lead 11. Accordingly, the surface area (the area along the plane perpendicular to the z direction) of each of the semiconductor elements 6a and 6b can be relatively large as compared to the case where the semiconductor element 6a and the semiconductor element 6b are arranged side by side on the same surface of the first lead 11.

Furthermore, according to the present embodiment, the first electrode 41 is electrically connected to the element second electrode 64 (source electrode) of the semiconductor element 6a via the wiring pattern 321, the via hole 223, the third lead 13, the via hole 213, the wiring pattern 311, and the via holes 211, and is electrically connected to the element second electrode 64 (source electrode) of the semiconductor element 6b via the wiring pattern 321 and the via holes 221. The element first electrode 63 (drain electrode) of the semiconductor element 6a is electrically connected to the first lead 11 via the conductive bonding layer 51, and is insulated from the second lead 12 by the insulating bonding layer 52. The element first electrode 63 (drain electrode) of the semiconductor element 6b is electrically connected to the second lead 12 via the conductive bonding layer 51, and is insulated from the first lead 11 by the insulating bonding layer 52. As such, the element first electrode 63 of the semiconductor element 6a and the element first electrode 63 of the semiconductor element 6b are insulated from each other, and the drain electrodes of the two semiconductor elements 6a and 6b are not common. This makes it possible to form a source common circuit in which the source electrodes of the two semiconductor elements 6a and 6b are connected to each other. As shown in FIG. 18, in the semiconductor device A5, the common source terminals (first electrodes 41) are connected to the ground, thereby enabling the MOSFETs (semiconductor elements 6a and 6b) to drive even if the control signal input to the gate terminal (fifth electrodes 45) have low voltage. This eliminates the need for a booster circuit for boosting the voltage of the control signal.

Figure 22:
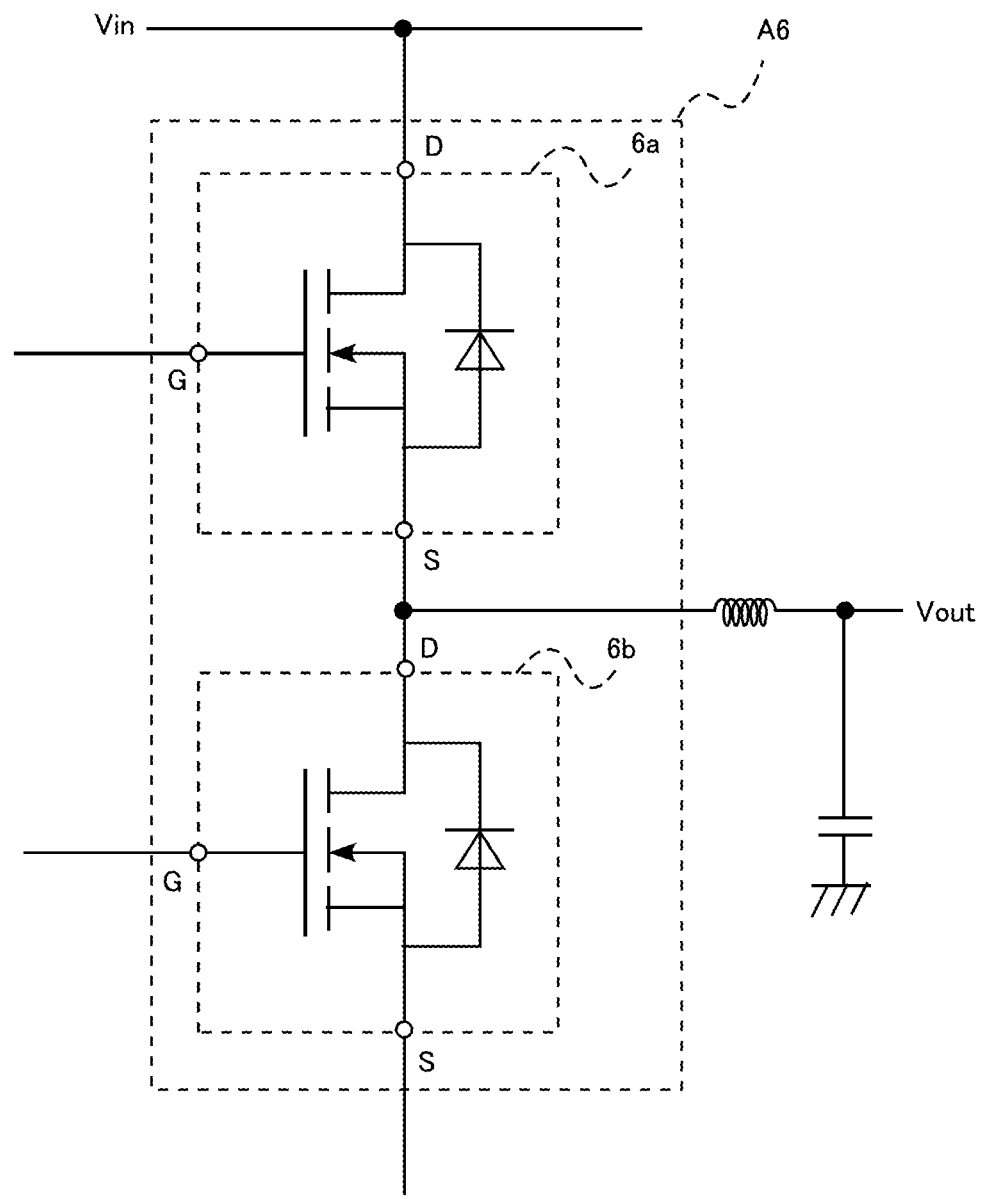
FIG. 22 is a circuit diagram showing a semiconductor device according to a sixth embodiment of the present disclosure.
Figure 23:
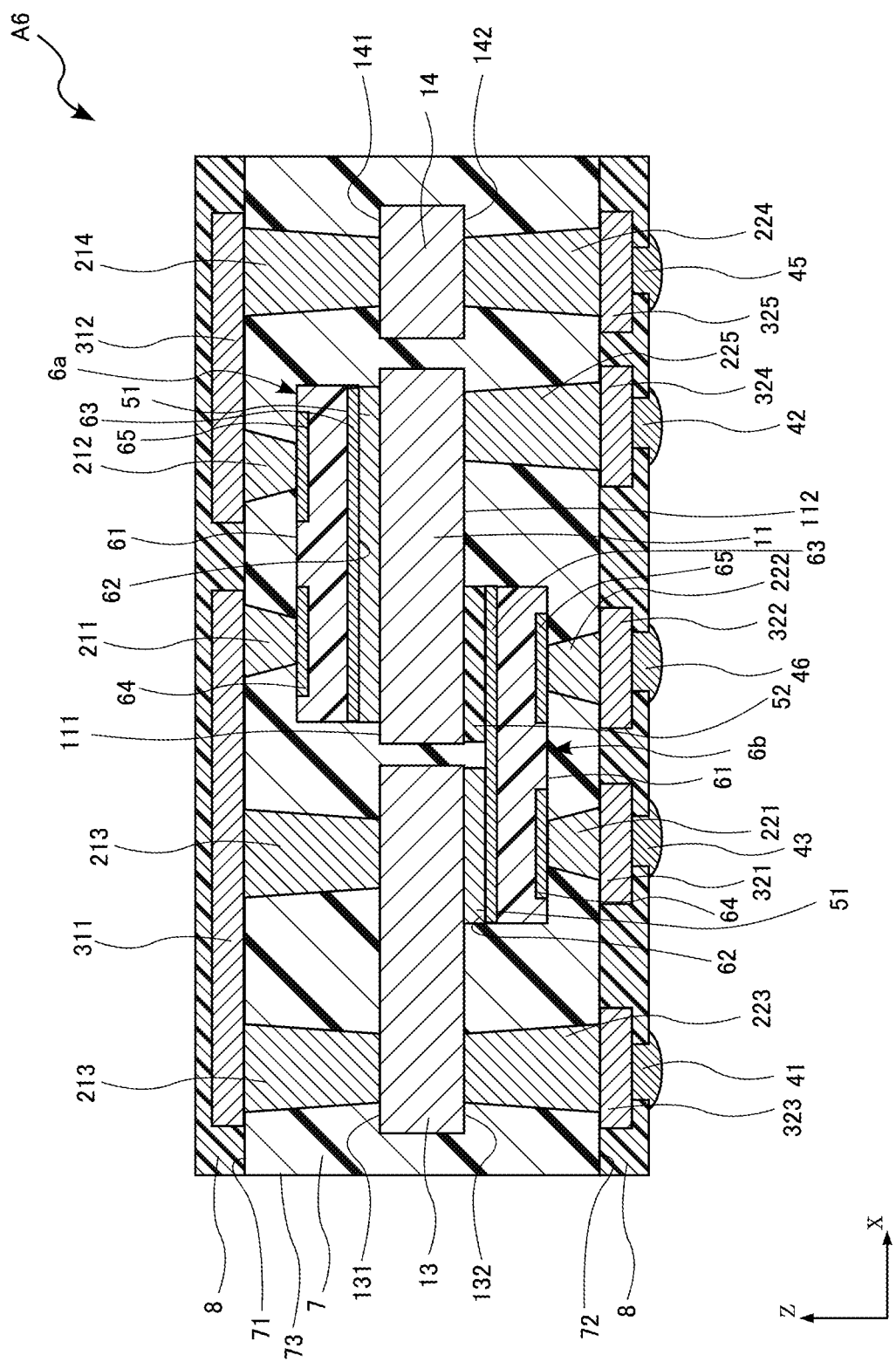
FIG. 23 is a schematic cross-sectional view showing the semiconductor device of FIG. 22.

The following describes a semiconductor device A6 according to a sixth embodiment of the present disclosure, with reference to FIGS. 22 and 23. In FIGS. 22 and 23, elements that are the same as or similar to those of the semiconductor device A1 are denoted by the same reference signs and descriptions thereof are omitted. FIG. 22 is a circuit diagram showing the semiconductor device A6, and corresponds to FIG. 2 showing the semiconductor device A1 according to the first embodiment. FIG. 23 is a schematic cross-sectional view showing the semiconductor device A6, and corresponds to FIG. 3 showing the semiconductor device A1 according to the first embodiment.

The semiconductor device A6 according to the present embodiment is different from the semiconductor device A1 according to the first embodiment in that the semiconductor device A6 is a circuit in which the source electrode of the semiconductor element 6a and the drain electrode of the semiconductor element 6b are connected to each other (see FIG. 22), instead of the common drain circuit in which the drain electrodes of the two semiconductor elements 6a and 6b are connected to each other. The semiconductor device A6 may be used as a bridge circuit for an inverter (see FIG. 22). As shown in FIG. 23, the semiconductor device A6 further includes an insulating bonding layer 52, a wiring pattern 325, and a sixth electrode 46.

The third lead 13 according to the present embodiment supports the semiconductor element 6b and is electrically connected to the semiconductor element 6b. As shown in FIG. 23, the semiconductor element 6b according to the present embodiment is mounted over the first lead 11 and the third lead 13. The semiconductor element 6b is bonded to the third lead 13 via the conductive bonding layer 51 and to the first lead 11 via the insulating bonding layer 52, with the element reverse surface 62 facing each of the reverse surface 112 and the reverse surface 132. As such, the element first electrode 63 of the semiconductor element 6b is electrically connected to the third lead 13 via the conductive bonding layer 51. On the other hand, the element first electrode 63 of the semiconductor element 6b is not electrically connected to the first lead 11 since the insulating bonding layer 52 is interposed between the element first electrode 63 of the semiconductor element 6b and the first lead 11. The insulating bonding layer 52 is similar to each of the insulating bonding layers 52 according to the fifth embodiment, and is an insulator interposed between the semiconductor element 6b and the first lead 11 as shown in FIG. 23. The semiconductor element 6b is bonded to the third lead 13 via the conductive bonding layer 51, and the conductive bonding layer 51 ensures that the element first electrode 63 of the semiconductor element 6b and the third lead 13 are electrically connected to each other. The semiconductor element 6b is also bonded to the first lead 11 via the insulating bonding layer 52, and the insulating bonding layer 52 ensures that the element first electrode 63 of the semiconductor element 6b is insulated from the first lead 11.

The wiring pattern 325 is similar to any of the wiring patterns 321 to 324, and is formed on the insulating-layer reverse surface 72 with a separation from each of the wiring patterns 321 to 324. The wiring pattern 325 is in contact with the via hole 224 and the fifth electrode 45 and electrically connects the via hole 224 and the fifth electrode 45. The sixth electrode 46 is similar to any of the first electrode 41, the second electrode 42, the third electrode 43, and the fifth electrode 45, and is in contact with and electrically connected to the wiring pattern 322. In the present embodiment, the fifth electrode 45 is electrically connected to the element third electrode 65 (gate electrode) of the semiconductor element 6a via the wiring pattern 325, the via hole 224, the fourth lead 14, the via hole 214, the wiring pattern 312, and the via hole 212, but is not electrically connected to the element third electrode 65 (gate electrode) of the semiconductor element 6b. On the other hand, the sixth electrode 46 is electrically connected to the element third electrode 65 (gate electrode) of the semiconductor element 6b via the wiring pattern 322 and the via hole 222. Accordingly, the fifth electrode 45 functions as a gate terminal of the semiconductor element 6a, and the sixth electrode 46 functions as a gate terminal of the semiconductor element 6b.

The first electrode 41 is electrically connected to the element second electrode 64 (source electrode) of the semiconductor element 6a via the wiring pattern 323, the via hole 223, the third lead 13, the via hole 213, the wiring pattern 311, and the via holes 211. The first electrode 41 is also electrically connected to the element first electrode 63 (drain electrode) of the semiconductor element 6b via the wiring pattern 323, the via hole 223, and the third lead 13. Accordingly, the first electrode 41 functions as a source terminal of the semiconductor element 6a, and functions as a drain terminal of the semiconductor element 6b. The semiconductor device A6 is a circuit in which the source electrode of the semiconductor element 6a and the drain electrode of the semiconductor element 6b are connected to each other (see FIG. 22).

Again in the present embodiment, the semiconductor element 6a is mounted on the obverse surface 111 of the first lead 11, and the semiconductor element 6b is mounted on the reverse surface 112 of the first lead 11. Accordingly, the surface area (the area along the plane perpendicular to the z direction) of each of the semiconductor elements 6a and 6b can be relatively large as compared to the case where the semiconductor element 6a and the semiconductor element 6b are arranged side by side on the same surface of the first lead 11.

Furthermore, according to the present embodiment, the first electrode 41 is electrically connected to the element second electrode 64 (source electrode) of the semiconductor element 6a via the wiring pattern 323, the via hole 223, the third lead 13, the via hole 213, the wiring pattern 311, and the via holes 211, and is electrically connected to the element first electrode 63 (drain electrode) of the semiconductor element 6b via the wiring pattern 323, the via hole 223, and the third lead 13. This makes it possible to form a circuit in which the source electrode of the semiconductor element 6a and the drain electrode of the semiconductor element 6b are connected to each other.

According to the present embodiment, the fifth electrode 45 is electrically connected to the element third electrode 65 (gate electrode) of the semiconductor element 6a, and the sixth electrode 46 is electrically connected to the element third electrode 65 (gate electrode) of the semiconductor element 6b. However, the fifth electrode 45 and the sixth electrode 46 are not electrically connected to each other. This makes it possible to individually control the semiconductor element 6a and the semiconductor element 6b by inputting different control signals to the fifth electrode 45 and the sixth electrode 46.

According to the present embodiment, the parasitic inductance between the element second electrode 64 (source electrode) of the semiconductor element 6a and the element first electrode 63 (drain electrode) of the semiconductor element 6b can be reduced.

Figure 24:
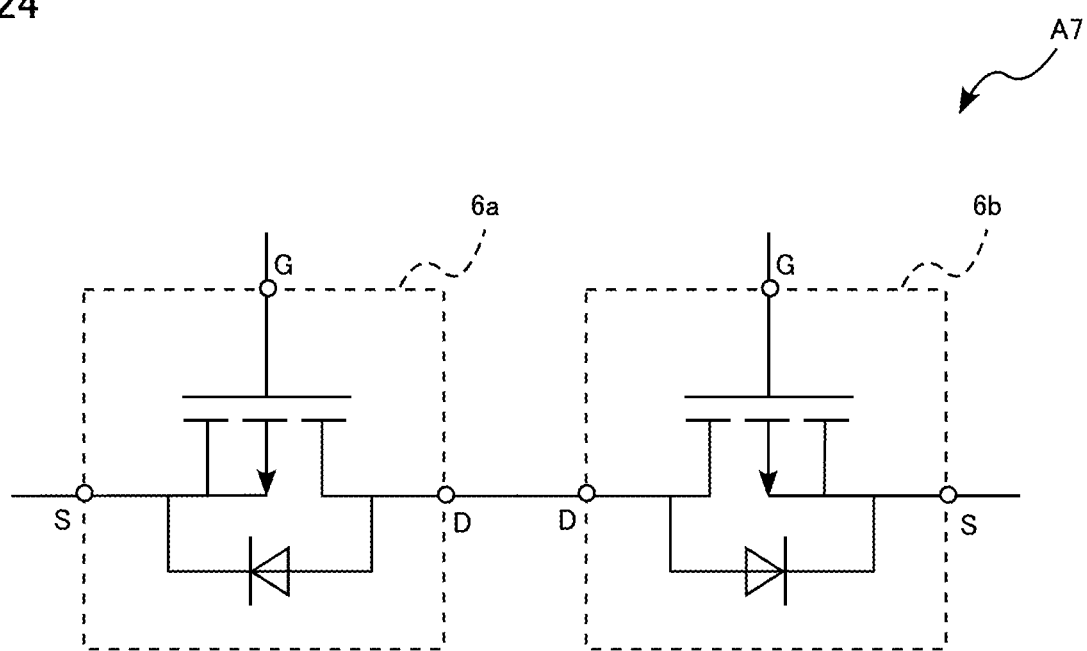
FIG. 24 is a circuit diagram showing a semiconductor device according to a seventh embodiment of the present disclosure.

The following describes a semiconductor device A7 according to a seventh embodiment of the present disclosure, with reference to FIG. 24. In FIG. 24, elements that are the same as or similar to those of the semiconductor device A1 are denoted by the same reference signs and descriptions thereof are omitted. FIG. 24 is a circuit diagram showing the semiconductor device A7, and corresponds to FIG. 2 showing the semiconductor device A1 according to the first embodiment.

The semiconductor device A7 according to the present embodiment is different from the semiconductor device A1 according to the first embodiment in that the two semiconductor elements 6a and 6b are P-type MOSFETs. Note that the semiconductor device A7 has the same structure as the semiconductor device A1 according to the first embodiment. Hence, the present embodiment can produce the same effect as the first embodiment.

Figure 25:
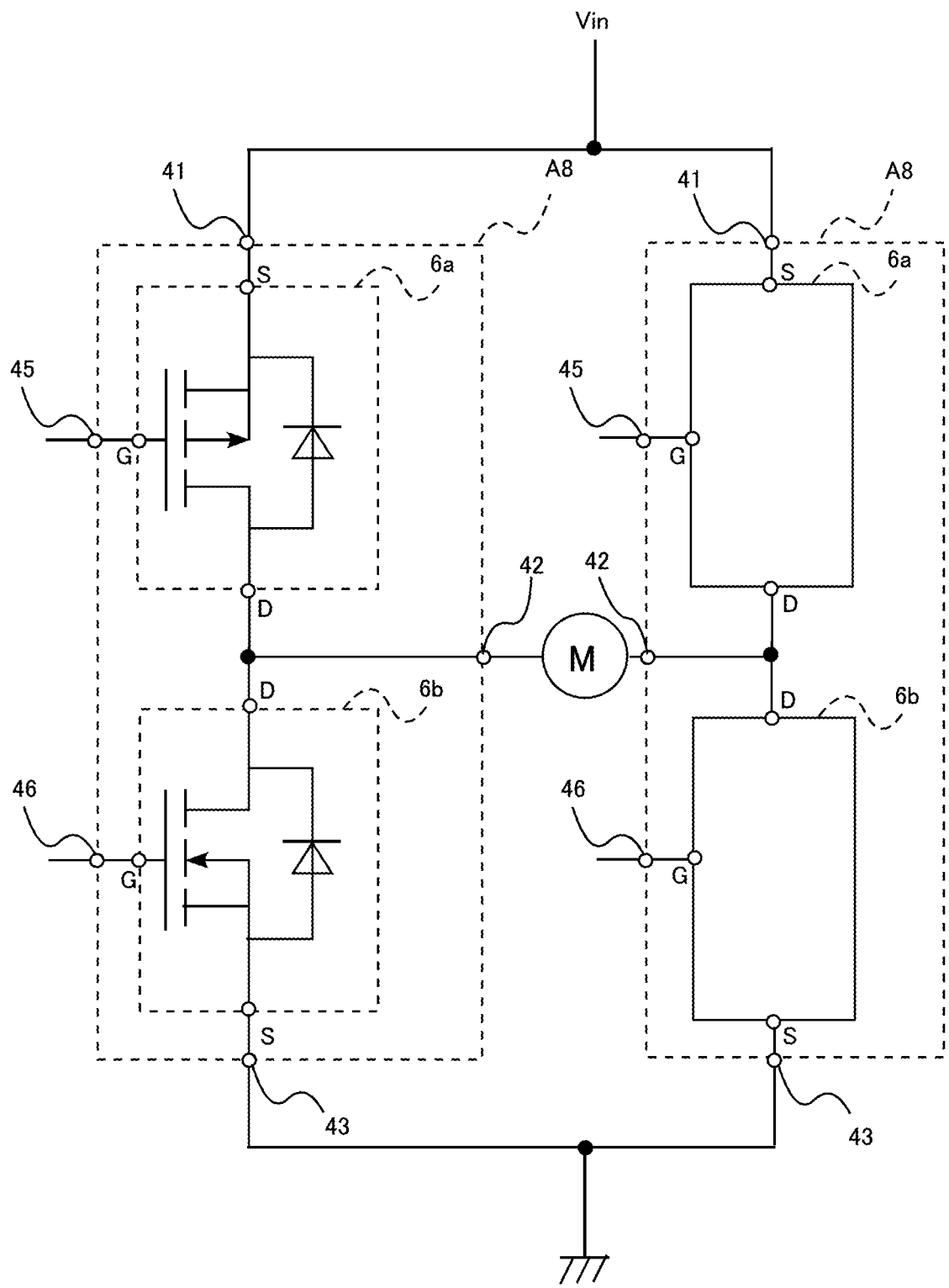
FIG. 25 is a circuit diagram showing a semiconductor device according to an eighth embodiment of the present disclosure.

The following describes a semiconductor device A8 according to an eighth embodiment of the present disclosure, with reference to FIG. 25. In FIG. 25, elements that are the same as or similar to those of the semiconductor device A2 are denoted by the same reference signs and descriptions thereof are omitted. FIG. 25 is a circuit diagram showing a motor drive circuit including the semiconductor device A8.

The semiconductor device A8 according to the present embodiment is different from the semiconductor device A1 according to the first embodiment in that the semiconductor element 6a is a P-type MOSFET, and the semiconductor element 6b is an N-type MOSFET. Note that the semiconductor device A8 has the same structure as the semiconductor device A2 according to the second embodiment. The motor drive circuit shown in FIG. 25 includes two semiconductor devices A8. A motor is connected between the second electrode 42 (see FIG. 15) that is a common drain terminal of one of the semiconductor devices A8 and the second electrode 42 of the other semiconductor device A8. Voltage Vin is input to the first electrodes 41 (see FIG. 15), each of which is a source terminal to which the source electrode of the semiconductor element 6a of each semiconductor device A8 is connected. The third electrodes 43 (see FIG. 15), each of which is a source terminal to which the source electrode of the semiconductor element 6b of each semiconductor device A8 is connected, are grounded. Drive signals are input to: the fifth electrode 45 (see FIG. 15) that is a gate terminal connected to the gate electrode of the semiconductor element 6a of one of the semiconductor devices A8; the sixth electrode 46 (see FIG. 15) that is a gate terminal connected to the gate electrode of the semiconductor element 6b of the one of the semiconductor devices A8; the fifth electrode 45 that is a gate terminal connected to the gate electrode of the semiconductor element 6a of the other semiconductor device A8; and the sixth electrode 46 that is a gate terminal connected to the gate electrode of the semiconductor element 6b of the other semiconductor device A8.

Since the semiconductor device A8 has the same structure as the semiconductor device A2 according to the second embodiment, the present embodiment can also produce the same effect as the second embodiment.

As shown in the seventh embodiment and the eighth embodiment, each of the semiconductor elements 6a and 6b may be an N-type MOSFET or a P-type MOSFET.

Figure 26:
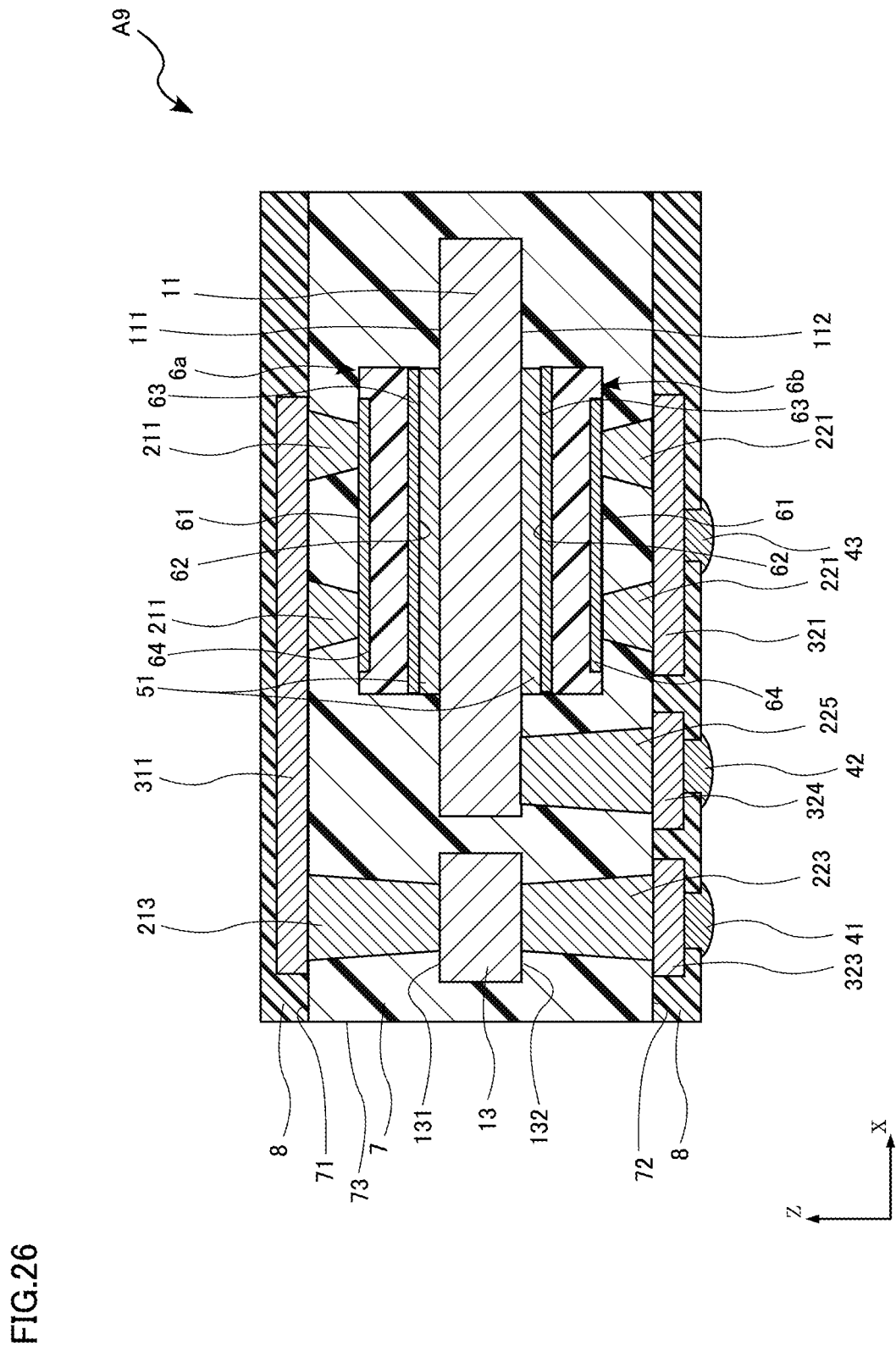
FIG. 26 is a schematic cross-sectional view showing a semiconductor device according to a ninth embodiment of the present disclosure.

The following describes a semiconductor device A9 according to a ninth embodiment of the present disclosure, with reference to FIG. 26. In FIG. 26, elements that are the same as or similar to those of the semiconductor device A1 are denoted by the same reference signs and descriptions thereof are omitted. FIG. 26 is a schematic cross-sectional view showing the semiconductor device A9, and corresponds to FIG. 3 showing the semiconductor device A1 according to the first embodiment.

The semiconductor device A9 according to the present embodiment is different from the semiconductor device A1 according to the first embodiment in that the two semiconductor elements 6a and 6b are diodes. As shown in FIG. 26, the semiconductor device A9 does not include any of the fourth lead 14, the via holes 212, 214, 222, and 224, the wiring patterns 312 and 322, and the fifth electrode 45.

Each of the semiconductor elements 6a and 6b is a diode, where the element first electrode 63 that is a cathode electrode is arranged on the element reverse surface 62, and the element second electrode 64 that is an anode electrode is arranged on the element obverse surface 61. The semiconductor device A9 is not provided with the element third electrode 65. Accordingly, the semiconductor device A9 does not include any of the via holes 212, 214, 222, and 224, the wiring patterns 312 and 322, and the fifth electrode 45, which function as the conductive paths of the element third electrodes 65 in the semiconductor device A1 according to the first embodiment.

The first electrode 41 is electrically connected to the element second electrode 64 (anode electrode) of the semiconductor element 6a, and therefore functions as an anode terminal of the semiconductor element 6a. The third electrode 43 is electrically connected to the element second electrode 64 (anode electrode) of the semiconductor element 6b, and therefore functions as an anode terminal of the semiconductor element 6b. The second electrode 42 is electrically connected to the element first electrode 63 (cathode electrode) of the semiconductor element 6a and the element first electrode 63 (cathode electrode) of the semiconductor element 6b, and therefore functions as a cathode electrode of each of the semiconductor element 6a and the semiconductor element 6b. The semiconductor device A9 is a common cathode circuit in which the cathode electrodes of the two semiconductor elements 6a and 6b are connected to each other. Note that the semiconductor device A9 may be a common anode circuit in which the semiconductor elements 6a and 6b are bonded to the first lead 11 with the element obverse surface 61 of each of the semiconductor elements 6a and 6b facing the first lead 11.

Again in the present embodiment, the semiconductor element 6a is mounted on the obverse surface 111 of the first lead 11, and the semiconductor element 6b is mounted on the reverse surface 112 of the first lead 11. Accordingly, the surface area (the area along the plane perpendicular to the z direction) of each of the semiconductor elements 6a and 6b can be relatively large as compared to the case where the semiconductor element 6a and the semiconductor element 6b are arranged side by side on the same surface of the first lead 11.

The semiconductor device according to the present disclosure is not limited to the above embodiments. Various design changes can be made to the specific configurations of the elements of the semiconductor device according to the present disclosure.

The invention claimed is:
1. A semiconductor device comprising:
a first semiconductor element including an element obverse surface and an element reverse surface that face opposite to each other in a thickness direction, the first semiconductor element being provided with a first element electrode disposed on the element reverse surface and with a second element electrode disposed on the element obverse surface;
a first lead including a lead obverse surface and a lead reverse surface that face opposite to each other in the thickness direction;
an insulating layer covering the first lead and the first semiconductor element;
a first electrode electrically connected to the second element electrode of the first semiconductor element;
a second electrode electrically connected to the first lead;
a wiring pattern; and
a via hole
wherein the first semiconductor element and the first lead are bonded to each other with the element reverse surface of the first semiconductor element facing the lead obverse surface,
the insulating layer includes an insulating-layer obverse surface and an insulating-layer reverse surface that face opposite to each other in the thickness direction,
the wiring pattern is formed on at least one of the insulating-layer obverse surface and the insulating-layer reverse surface,
the via hole is open to the insulating-layer obverse surface or the insulating-layer reverse surface,
the wiring pattern and the via hole forms a conductive path between the second element electrode of the first semiconductor element and the first electrode, and a conductive path between the first lead and the second electrode.

2. The semiconductor device according to claim 1, wherein the first electrode and the second electrode are disposed on the insulating-layer reverse surface.

3. The semiconductor device according to claim 1, wherein the first element electrode of the first semiconductor element is electrically connected to the first lead.

4. The semiconductor device according to claim 1, further comprising a third lead electrically connected to the second element electrode of the second semiconductor element and to the first lead, wherein the third lead is covered by the insulating layer.

5. The semiconductor device according to claim 1, further comprising a fifth electrode, wherein the first semiconductor element is provided with a third element electrode disposed on the element obverse surface, and
the fifth electrode is electrically connected to the third element electrode of the first semiconductor element.

6. The semiconductor device according to claim 5, wherein the first semiconductor element comprises a transistor.

7. The semiconductor device according to claim 5, further comprising a fourth lead electrically connected to the third element electrode of the first semiconductor element and to the fifth electrode, wherein the fourth lead is covered by the insulating layer.

8. The semiconductor device according to claim 1, wherein the lead obverse surface includes an obverse-surface recess, and the first semiconductor element is disposed in the obverse-surface recess.

9. A semiconductor device comprising:
a first semiconductor element including an element obverse surface and an element reverse surface that face opposite to each other in a thickness direction, the first semiconductor element being provided with a first element electrode disposed on the element reverse surface and with a second element electrode disposed on the element obverse surface;
a first lead including a lead obverse surface and a lead reverse surface that face opposite to each other in the thickness direction;
an insulating layer covering the first lead and the first semiconductor element;
a first electrode electrically connected to the second element electrode of the first semiconductor element;
a second electrode electrically connected to the first lead; and
a second lead to which the element reverse surface is bonded,
wherein the first semiconductor element and the first lead are bonded to each other with the element reverse surface of the first semiconductor element facing the lead obverse surface,
the first element electrode of the first semiconductor element is electrically connected to the first lead.

10. The semiconductor device according to claim 9, wherein the first semiconductor element is bonded to the first lead via an electroconductive bonding layer and to the second lead via an insulating bonding layer.

11. The semiconductor device according to claim 9, further comprising a third lead electrically connected to the second element electrode of the first semiconductor element and to the first electrode, wherein the third lead is covered by the insulating layer.

12. The semiconductor device according to claim 9, further comprising a fifth electrode, wherein the first semiconductor element is provided with a third element electrode disposed on the element obverse surface, and the fifth electrode is electrically connected to the third element electrode of the first semiconductor element.

13. The semiconductor device according to claim 12, wherein the first semiconductor element comprises a transistor.

14. The semiconductor device according to claim 12, further comprising a fourth lead electrically connected to the third element electrode of the first semiconductor element and to the fifth electrode, wherein the fourth lead is covered by the insulating layer.

15. The semiconductor device according to claim 9, wherein the lead obverse surface includes an obverse-surface recess, and the first semiconductor element is disposed in the obverse-surface recess.

16. A semiconductor device comprising:
a first semiconductor element including an element obverse surface and an element reverse surface that face opposite to each other in a thickness direction, the first semiconductor element being provided with a first element electrode disposed on the element reverse surface and with a second element electrode disposed on the element obverse surface;
a first lead including a lead obverse surface and a lead reverse surface that face opposite to each other in the thickness direction;
an insulating layer covering the first lead and the first semiconductor element;
a first electrode electrically connected to the second element electrode of the first semiconductor element;
a second electrode electrically connected to the first lead; and
a third lead electrically connected to the second element electrode of the first semiconductor element and to the first electrode, the third lead being covered by the insulating layer, wherein the first semiconductor element and the first lead are bonded to each other with the element reverse surface of the first semiconductor element facing the lead obverse surface, the first element electrode of the first semiconductor element is electrically connected to the first lead.

17. The semiconductor device according to claim 16, wherein the first semiconductor element is bonded to the first lead via an electroconductive boding layer.

18. The semiconductor device according to claim 16, further comprising a fifth electrode, wherein the first semiconductor element is provided with a third element electrode disposed on the element obverse surface, and the fifth electrode is electrically connected to the third element electrode of the first semiconductor element.

19. The semiconductor device according to claim 18, wherein the first semiconductor element comprises a transistor.

20. The semiconductor device according to claim 18, further comprising a fourth lead electrically connected to the third element electrode of the first semiconductor element and to the fifth electrode, wherein the fourth lead is covered by the insulating layer.

21. The semiconductor device according to claim 16, wherein the lead obverse surface includes an obverse-surface recess, and the first semiconductor element is disposed in the obverse-surface recess.

\* \* \* \* \*